(12) United States Patent
Kaczmarek et al.

(10) Patent No.: US 10,600,482 B2
(45) Date of Patent: Mar. 24, 2020

(54) QUANTUM MEMORY DEVICE

(71) Applicant: OXFORD UNIVERSITY INNOVATION LIMITED, Oxford (GB)

(72) Inventors: Krzysztof Kaczmarek, Oxford (GB); Joshua Nunn, Oxford (GB); Eilon Poem, Oxford (GB); Amir Feizpour, Oxford (GB)

(73) Assignee: OXFORD UNIVERSITY INNOVATION LIMITED, Oxford (GB)

( * ) Notice: Subject to any disclaimer, the term of this patent is extended or adjusted under 35 U.S.C. 154(b) by 0 days.

(21) Appl. No.: 16/308,700

(22) PCT Filed: Mar. 30, 2017

(86) PCT No.: PCT/GB2017/050892
§ 371 (c)(1),
(2) Date: Dec. 10, 2018

(87) PCT Pub. No.: WO2017/212212
PCT Pub. Date: Dec. 14, 2017

(65) Prior Publication Data
US 2019/0164607 A1 May 30, 2019

(30) Foreign Application Priority Data

Jun. 10, 2016 (GB) .................................. 1610192.5

(51) Int. Cl.
*G11C 13/04* (2006.01)
*G06N 10/00* (2019.01)
(52) U.S. Cl.
CPC ........... *G11C 13/048* (2013.01); *G06N 10/00* (2019.01); *G11C 13/04* (2013.01)

(58) Field of Classification Search
None
See application file for complete search history.

(56) References Cited

U.S. PATENT DOCUMENTS 10,380,496 B2 *  8/2019  Elsherbini .............. G06N 10/00
2004/0109633 A1   6/2004  Pittman et al.
(Continued)

FOREIGN PATENT DOCUMENTS

WO       2011073656 A1      6/2011

OTHER PUBLICATIONS

Ding, Dong-Sheng, et al., "Entanglement between Rydberg excited state and ground-state spin wave," Conference on Lasers and Electro-Optics, Jun. 5-10, 2016, San Jose, California, IEEE, 14 pages.

(Continued)

*Primary Examiner* — Tan T. Nguyen
(74) *Attorney, Agent, or Firm* — Withrow & Terranova, P.L.L.C.; Vincent K. Gustafson

(57) ABSTRACT

A quantum memory device includes an atomic ensemble (4) and a signal source of electromagnetic radiation (10) for generating modes to be stored and having a frequency corresponding to an off-resonant transition between first and second states in the atomic ensemble. The quantum memory device also includes a control source of electromagnetic radiation (12) for generating electromagnetic radiation having a frequency corresponding to an off-resonant atomic transition between second and third states in the atomic ensemble; the third state has a higher energy than the second state which has a higher energy than the first state. The signal source and the control source create a coherent excitation of the transition between the first state and the third state such that the atomic ensemble stores the signal source modes, and the control source subsequently stimu- (Continued)

lates emission of the stored modes from the atomic ensemble.

20 Claims, 5 Drawing Sheets

(56) References Cited

U.S. PATENT DOCUMENTS

2011/0222387 A1 9/2011 Ham
2013/0279235 A1 10/2013 Le Gouet et al.
2014/0092467 A1 4/2014 Chuu et al.

OTHER PUBLICATIONS

Duden, Y.O., et al., "Strongly Interacting Rydberg Excitations of a Cold Atomic Gas," Science, vol. 336, May 2012, pp. 887-889.
Gea-Banacloche, Julio, et al., "Electromagnetically induced transparency in ladder-type inhomogeneously broadened media: Theory and experiment," vol. 51, Issue 1, Physical Review A, Jan. 1995, The American Physical Society, pp. 576-584.
Huber, B., et al., "Motion-induced signal revival in pulsed Rydberg four-wave mixing beyond the frozen-gas limit," vol. 90, Issue 5, Physical Review A, Nov. 2014, American Physical Society, 6 pages.
Maxwell, D., et al., "Storage and Control of Optical Photons Using Rydberg Polaritons," Physical Review Letters, Mar. 8, 2013, American Physical Society, 5 pages.
Sprague, M.R., et al., "Broadband single-photon-level memory in a hollow-core photonic crystal fibre," Nature Photonics, vol. 8, Apr. 2014, Macmillan Publishers Limited, pp. 287-291.
International Search Report and Written Opinion for PCT/GB2017/050892, dated Jul. 3, 2017, 12 pages.
International Preliminary Report on Patentability for PCT/GB2017/050892, dated Dec. 20, 2018, 10 pages.
Search Report for United Kingdom Patent Application No. GB1610192.5, dated Sep. 29, 2016, 4 pages.

* cited by examiner

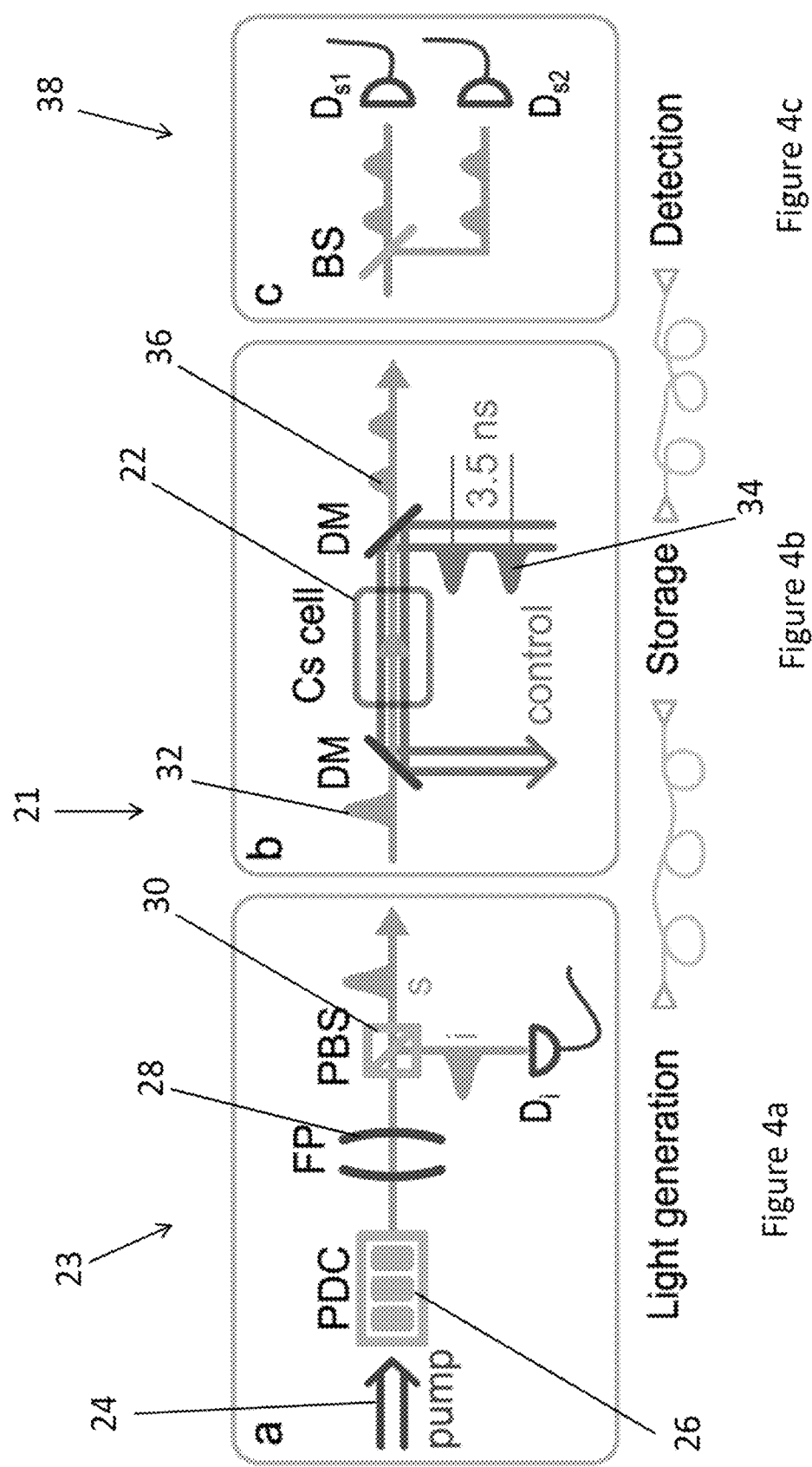
Figure 4a Light generation
Figure 4b Storage
Figure 4c Detection

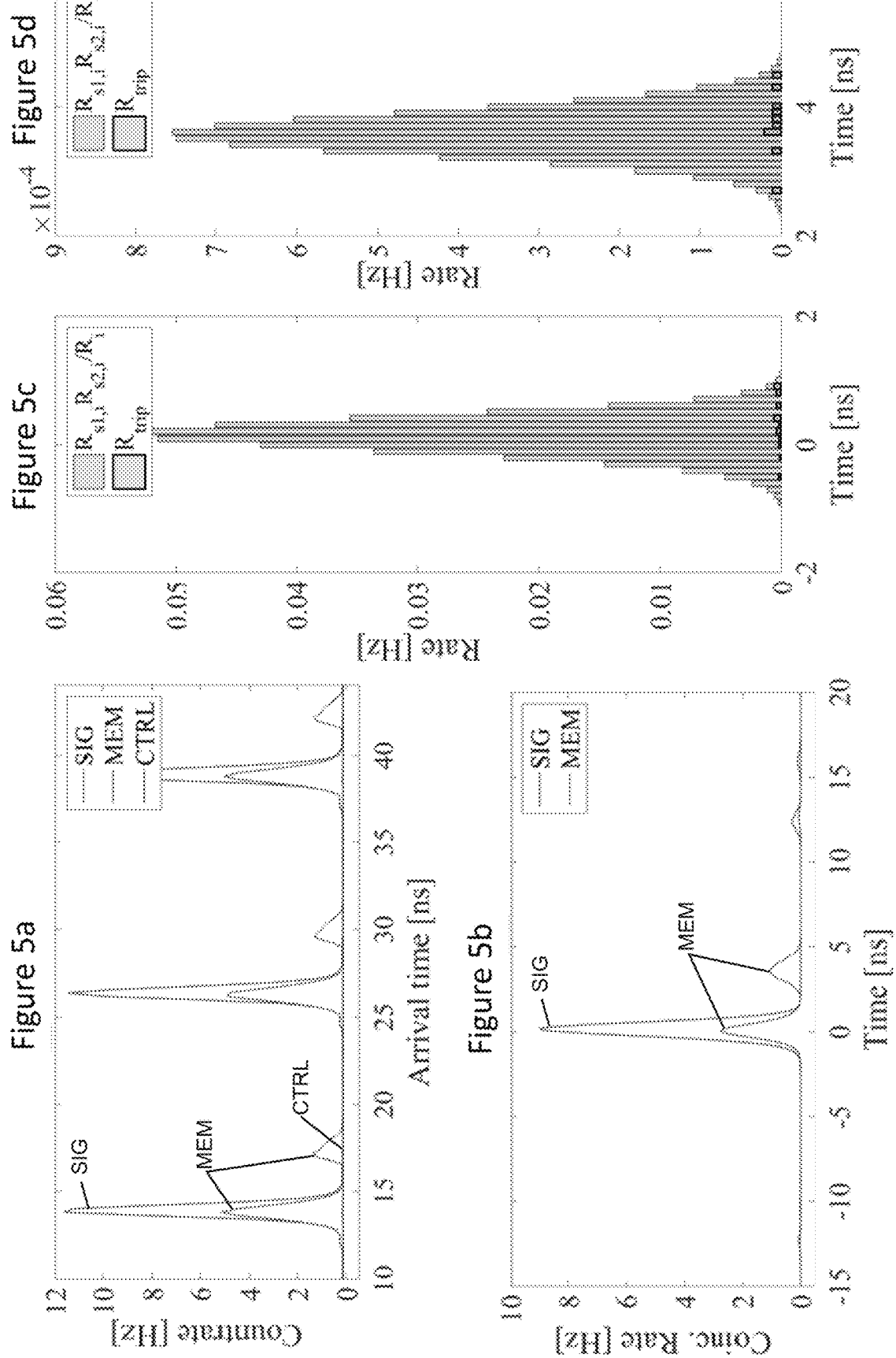

QUANTUM MEMORY DEVICE

This application is a 35 U.S.C. § 371 national phase filing of International Application No. PCT/GB2017/050892 filed on Mar. 30, 2017, and claims the benefit of United Kingdom Patent Application No. 1610192.5 filed on Jun. 10, 2016, wherein the disclosures of the foregoing applications are hereby incorporated by reference herein in their respective entireties.

This invention relates to a quantum memory device for storing one or more modes of electromagnetic radiation, in particular to a quantum memory device including an atomic ensemble.

A quantum memory is an important part of a quantum information processing system, e.g. a quantum computer. When implemented using photons, a quantum memory provides an interface between light and matter that allows for the storage and retrieval of photonic quantum information, e.g. the quantum state of the stored photons.

Optical photons are good carriers of quantum information owing to having low thermal noise, e.g. being unaffected by black body radiation at room temperature and being weakly affected by environmental decoherence (e.g. for photons having a frequency of hundreds of THz). However, the negligible interactions of photons (the property that makes them suitable for the transmission of quantum information) make it difficult to store such information, hence why a quantum memory is important.

Previous attempts to provide a quantum memory include that described in WO 2011/073656. This system uses Raman interactions in an atomic ensemble having a lambda-level transition structure, with two ground states being used together with an excited state for the storage of photons. However, this system suffers from noise (at the level of approximately 0.1 photons per pulse when addressing the quantum memory) owing to cross-coupling of the optical fields used.

This level of noise has a deleterious effect on the efficient control of logic gates in quantum information processing. The noise may be reduced by using an optical cavity around the system and/or using optical pumping; however this then makes the system rather complicated and difficult to integrate into a quantum information processing system.

It is an aim of the present invention to provide an improved quantum memory.

When viewed from a first aspect the invention provides a quantum memory device for storing one or more modes of electromagnetic radiation, the quantum memory device comprising:

an atomic ensemble comprising atomic valence electrons having a first state, a second state and a third state, wherein the second state has a higher energy than, and is linked to, the first state by an atomic transition, and the third state has a higher energy than, and is linked to, the second state by one or more atomic transitions;

a signal source of electromagnetic radiation arranged to generate one or more modes of electromagnetic radiation to be stored having a frequency corresponding to an off-resonant atomic transition between the first state and the second state of atomic valence electrons in the atomic ensemble, wherein the one or more modes of electromagnetic radiation from the signal source are arranged to be incident upon the atomic ensemble to stimulate off-resonant transitions of the atomic valence electrons in the atomic ensemble between the first state and the second state;

one or more control sources of electromagnetic radiation each arranged to generate electromagnetic radiation having a frequency corresponding to an off-resonant atomic transition from the one or more atomic transitions linking the second state and the third state of atomic valence electrons in the atomic ensemble, wherein the electromagnetic radiation from the one or more control sources is arranged to be incident upon the atomic ensemble to stimulate off-resonant transitions of the atomic valence electrons in the atomic ensemble between the second state and the third state;

wherein the quantum memory device is arranged such that on incidence of one or more modes of electromagnetic radiation from the signal source and electromagnetic radiation from each of the one or more control sources to the atomic ensemble, a coherent excitation of the transition between the first state and the third state is created that stores the one or more modes of electromagnetic radiation from the signal source in the atomic ensemble, and subsequent incidence of electromagnetic radiation from each of the one or more control sources upon the atomic ensemble stimulates emission of the one or more stored modes of electromagnetic radiation from the atomic ensemble; and wherein the inverse of the residual Doppler linewidth owing to the incidence of the electromagnetic radiation generated by the signal source and the one or more control sources on the atomic valence electrons in the atomic ensemble is greater than half the lifetime of the coherent excitation of the transition between the first state and the third state.

When viewed from a second aspect the invention provides a method of storing and retrieving one or more modes of electromagnetic radiation in a quantum memory device, the quantum memory device comprising:

an atomic ensemble comprising atomic valence electrons having a first state, a second state and a third state, wherein the second state has a higher energy than, and is linked to, the first state by an atomic transition, and the third state has a higher energy than, and is linked to, the second state by one or more atomic transitions;

the method comprising:

storing one or more modes of electromagnetic radiation in the atomic ensemble by:

stimulating off-resonant transitions of the atomic valence electrons in the atomic ensemble between the first state and the second state by arranging for one or more modes of electromagnetic radiation generated by a signal source of electromagnetic radiation to be incident upon the atomic ensemble, wherein the frequency of the electromagnetic radiation from the signal source corresponds to an off-resonant atomic transition between the first state and the second state of atomic valence electrons in the atomic ensemble; and stimulating off-resonant transitions of the atomic valence electrons in the atomic ensemble between the second state and the third state by arranging for electromagnetic radiation generated by one or more control sources of electromagnetic radiation to each be incident upon the atomic ensemble, wherein the frequency of the electromagnetic radiation from the one or more control sources each corresponds to an off-resonant atomic transition from the one or more atomic transitions linking the second state and the third state of atomic valence electrons in the atomic ensemble;

wherein the one or more modes of electromagnetic radiation from the signal source and the electromagnetic radiation from each of the one or more control sources are arranged to be incident upon the atomic ensemble such that a coherent excitation of the transition between the first state and the third state is created that stores the one or more modes of electromagnetic radiation from the signal source in the atomic ensemble;

wherein the inverse of the residual Doppler linewidth owing to the incidence of the electromagnetic radiation generated by the signal source and the one or more control sources on the atomic valence electrons in the atomic ensemble is greater than half the lifetime of the coherent excitation of the transition between the first state and the third state; and retrieving the one or more modes of electromagnetic radiation that have been stored in the atomic ensemble by:

further stimulating off-resonant transitions of the atomic valence electrons in the atomic ensemble between the second state and the third state by arranging for electromagnetic radiation generated by one or more control sources of electromagnetic radiation to each be incident upon the atomic ensemble after the one or more modes of electromagnetic radiation generated by the signal source have been stored in the atomic ensemble;

wherein the electromagnetic radiation from each of the one or more control sources is arranged to be incident upon the atomic ensemble to stimulate emission of the one or more stored modes of electromagnetic radiation from the atomic ensemble.

The present invention therefore provides a quantum memory device for and a method of storing and retrieving one or more modes of electromagnetic radiation. The quantum memory device includes an atomic ensemble that acts as the storage medium for the modes of electromagnetic radiation to be stored. The atomic valence electrons of the atomic ensemble have a plurality of energy states and transitions therebetween. These include first, second and third states, the first and second states being linked by an atomic transition and the second and third states being linked by one or more atomic transitions. The third state has a higher energy than the second state, which in turn has a higher energy than the first state, i.e. these three states have a "ladder" configuration in the atomic ensemble.

The quantum memory device also includes a signal source of electromagnetic radiation and one or more control sources of electromagnetic radiation that are each arranged to generate electromagnetic radiation that is to be incident upon the atomic ensemble to stimulate off-resonant transitions of the atomic valence electrons in the atomic ensemble. The electromagnetic radiation generated by the signal source (the one or more modes to be stored) has a frequency that corresponds to an off-resonant atomic transition between the first state and the second state of atomic valence electrons in the atomic ensemble. Thus, when the one or more modes of electromagnetic radiation from the signal source are incident upon the atomic ensemble, off-resonant transitions of the atomic valence electrons in the atomic ensemble between the first state and the second state are stimulated.

The electromagnetic radiation generated by the one or more control sources each has a frequency that corresponds to an off-resonant atomic transition from the one or more atomic transitions linking the second state and the third state of atomic valence electrons in the atomic ensemble. Thus, when the electromagnetic radiation from the one or more control sources is incident upon the atomic ensemble, off-resonant transitions of the atomic valence electrons in the atomic ensemble between the second state and the third state (i.e. via the one or more atomic transitions linking the second state and the third state of atomic valence electrons in the atomic ensemble) are stimulated.

The signal source and the one or more control sources of electromagnetic radiation are arranged such that the incidence of the electromagnetic radiation generated by these sources on the atomic valence electrons in the atomic ensemble has a residual Doppler linewidth whose inverse is greater than half the lifetime of the coherent excitation of the transition between the first state and the third state (i.e. $1/\Delta W_D > \tau_{13}/2$, where $\Delta W_D$ is the residual Doppler linewidth owing to the incidence of the electromagnetic radiation generated by the signal source and the one or more control sources on the atomic valence electrons in the atomic ensemble and $\tau_{13}$ is the lifetime of the coherent excitation of the transition between the first state and the third state).

The residual Doppler linewidth, $\Delta W_D$, is the (scalar) product of the residual wave vector of the electromagnetic radiation generated by the signal source and the one or more control sources, and the thermal velocity of the atoms in the atomic ensemble (i.e. $\Delta W_D = \Delta k \cdot v$, where $\Delta k$ is the residual wave vector of the electromagnetic radiation generated by the signal source and the one or more control sources (i.e. the vector sum of the wave vectors of the electromagnetic radiation from each of the signal source and the one or more control sources) and v is the thermal velocity of the atoms in the atomic ensemble).

The quantum memory device is configured such that when the one or more modes of electromagnetic radiation from the signal source and the one or more control sources is incident upon the atomic ensemble, this creates a coherent excitation of the transition between the first state and the third state. This coherent excitation is such that the device stores the one or more modes of electromagnetic radiation from the signal source in the atomic ensemble (i.e. the modes are "written" to the quantum memory). In order to retrieve the one or more modes of electromagnetic radiation that have been stored in the atomic ensemble, after a storage time (e.g. less than the lifetime of the coherence between the first and third states), the subsequent application of electromagnetic radiation from the one or more control sources to be incident upon the atomic ensemble causes the output of the stored modes of electromagnetic radiation from the atomic ensemble (i.e. the modes are "read" from the quantum memory).

Thus it will be appreciated that the quantum memory device of the present invention provides a quantum memory for storing one or more modes of electromagnetic radiation in an atomic ensemble, through use of a "ladder" transition structure of the atomic valence electrons in the atomic ensemble. The incidence of the one or more modes of electromagnetic radiation from the signal source and the electromagnetic radiation from the one or more control sources is such that a resonance on the transition between the first and third states is induced. Without the electromagnetic radiation from the one or more control sources the atomic ensemble would be transparent to the one or more modes of electromagnetic radiation from the signal source (owing to the frequency of the signal source electromagnetic radiation being off-resonant from the transition between the first and second states). However, the application of the electromagnetic radiation from the one or more control sources create an absorption feature that converts the signal source electromagnetic radiation into a coherent excitation (i.e. the electromagnetic radiation from the signal source and one or more control sources together) of the transition between the first and third states.

The ladder structure of the first, second and third states is such that the atomic ensemble is able to store one or more modes of electromagnetic radiation in a high-lying excitation (i.e. that generated by the spontaneous excitation of the third state) which is even higher than the intermediate (second) state used to couple the signal and control fields in the coherent excitation. Preferably there is no direct coupling (i.e. a single photon transition) to the first, e.g. ground, state from the third (highest) state.

Owing to this "ladder" configuration of the atomic states used in the quantum memory devices, which stores the one or more modes of electromagnetic radiation from the signal source in a high-lying excitation, the thermal noise of the system may be greatly reduced. This is because there may be very little (preferably no) thermal population of the third state, as preferably the energy level of the third state is much greater than the characteristic thermal energy scale.

This contrasts with the quantum memory system described in WO 2011/073656 that used Raman interactions in an atomic ensemble having a lambda-level transition structure, with a couple of low-energy, e.g. ground, states being used together with a higher ancillary state for the storage of photons. Owing to the coupling to the low-energy states through both of the transitions used in this arrangement, this system suffers from noise owing, e.g., to the large thermal population of the ground state (as its energy is much less than the characteristic thermal energy scale at, e.g., room temperature), which is substantially removed from the quantum memory device of the present invention.

The Raman system disclosed in WO 2011/073656 also suffers from four-wave mixing noise owing to the coupling of the control field to the ground state that causes spurious excitations of the storage state by spontaneous Raman scattering (the other two waves involved are from the retrieval of these spurious excitations from the memory as if they were real, giving a four-wave mixing process). This is because of the lambda configuration of the states which results in both transitions that are used having similar energies and both coupling to low-lying, e.g. ground, states.

The "ladder" configuration of the present invention helps to eliminate noise from four-wave mixing because the analogous mechanism is absent in the quantum memory device of the present invention. This is because the third state lies higher in energy than the second state, such that the electromagnetic radiation from the one or more control sources cannot stimulate transitions between the first and third states.

The use of off-resonant transitions between the first and second states, and the second and third states (owing to the choice of the frequencies of the signal source electromagnetic radiation and the electromagnetic radiation from the one or more control sources), may also help to reduce the noise by helping to remove fluorescence noise. This is because the electromagnetic radiation from the one or more control sources has a sum of frequencies that is preferably chosen to be (e.g. far) outside the collisional linewidth of the transition between the first and second states (if the sum of frequencies of the electromagnetic radiation from the one or more control sources was within the collisional linewidth of the transition between the first and second states then it would couple to this transition and cause fluorescence).

This again contrasts with the quantum memory system described in WO 2011/073656 in which the splitting between the two low-lying states is only a few GHz, meaning that the control and signal fields are both close to resonance with each transition, in particular within the collision induced fluorescence linewidth. This causes fluorescence noise from the control field on the transition intended to be stimulated by the signal field.

The lack of (e.g. thermal and/or fluorescence) noise involved in the storage of the modes of electromagnetic radiation in the atomic ensemble means that there may be no need to prepare the states of the atomic valence electrons being used in the atomic ensemble, e.g. using (e.g. cryogenic) cooling and/or optical pumping, since the (excited) second and third states are empty at room temperature. The lack of cooling and/or optical pumping thus helps to provide a quantum memory device that is technically simple.

Furthermore, the lack of optical pumping may remove the barrier (e.g. present in the Raman interaction system described in WO 2011/073656) to operation with relatively high atomic densities that is caused by the radiation trapping of the optical pumping. Being able to operate at higher atomic densities may help to achieve higher efficiencies (owing to the greater probability of interactions of the incident electromagnetic radiation with the atomic valence electrons of the atomic ensemble), even with the off-resonant transitions employed in the quantum memory device of the present invention.

The use of off-resonant transitions between the first and second states, and the second and third states, thus allowing off-resonant storage of the modes of electromagnetic radiation from the signal source in the quantum memory, may allow the signal source electromagnetic radiation and/or the electromagnetic radiation from the one or more control sources to have a relatively large bandwidth. This, in turn, may help to allow the signal source electromagnetic radiation and/or the electromagnetic radiation from the one or more control sources to comprise short pulses, as will be discussed below.

As will be seen, using short pulses may help to exploit the device as a quantum memory, e.g. enabling the device to have fast operation. This may help to extend the number of computational cycles that are able to be completed before decoherence of the stored modes sets in, thereby helping to provide a robust and reliable quantum memory.

Being able to operate with a relatively large bandwidth (owing to the use of off-resonant transitions) to help give fast operation owing, in some embodiments, to the ability to use short pulses of electromagnetic radiation for being incident upon the atomic ensemble, helps to overcome a traditional problem with quantum memory devices that long-lived atomic states (having narrow linewidths) have previously been used in order to achieve storage over any significant amount of time (e.g. long enough to synchronise with the storage of other modes). As described above, the lower coupling of electromagnetic radiation having frequencies that are off-resonant from the transitions in the atomic ensemble being stimulated, may still allow an efficient quantum memory device to be provided, owing to the lack of noise in the device, which may allow a higher density atomic ensemble to be used, thus compensating for the weak coupling.

Furthermore, the near Doppler cancellation of the signal source electromagnetic radiation with the electromagnetic radiation from the one or more control sources, owing to the inverse of the residual Doppler linewidth being greater than half the lifetime of the coherent excitation of the transition between the first state and the third state, helps reduce Doppler dephasing (the detrimental effect of the thermal motion of the atoms on the lifetime) of the coherent excitation between the first and third states. Reducing any Doppler shifts thus helps to avoid having to cool the atomic ensemble and also helps to maintain the two-transition system (the coherent excitation of the first, second and third states).

Thus it will be appreciated that the quantum memory device of the present invention may allow the quantum storage of one or more modes of electromagnetic radiation in an efficient manner that is relatively technically simple to implement, without the problems of noise experienced in previous systems.

The atomic ensemble may comprise any suitable and desired atoms. In a preferred embodiment the atomic ensemble comprises alkali metal atoms (group 1 elements) or alkali earth metal atoms (group 2 elements), e.g. strontium. Alkali metal atoms are suited for use in the quantum memory device of the present invention because they have only a single valence electron, that is orbiting a positively charged core, and which can be excited to the second and third states, with the spectrum of valence electrons in such alkali metal atoms being well understood, controllable and suitable for the quantum memory device of the present invention. Preferably the atomic ensemble comprises rubidium atoms, caesium atoms or sodium atoms. Preferably the atomic ensemble contains only a single type of atoms, e.g. one of rubidium atoms, caesium atoms or sodium atoms.

The atomic ensemble may be prepared in any suitable and desired state, e.g. owing to its temperature as discussed below. In one embodiment the atomic ensemble is a solid, e.g. a crystal, e.g. a rare earth doped crystal. However preferably the atomic ensemble is a gas, e.g. a vapour. Providing the atomic ensemble in a gaseous or vaporous form helps to allow long coherence times for the interaction between the signal source electromagnetic radiation and/or the electromagnetic radiation from the one or more control sources, and the atomic valence electrons of the atomic ensemble. This contrasts to a solid state atomic ensemble that may suffer from phonon-induced dephasing (lattice vibrations), e.g. when not cooled.

In preferred embodiments the atomic ensemble comprises atoms having an open valence shell of atomic valence electrons, e.g. alkali metal atoms or alkali earth metal atoms. However the Applicants have also appreciated that the atomic ensemble could comprise noble gas atoms that are, e.g., pumped into an excited metastable state (e.g. having a relatively long lifetime), with this metastable state forming the first state of the atomic valence electrons in the atomic ensemble.

The atomic ensemble may be provided in the quantum memory device in any suitable and desired way. In a preferred embodiment the quantum memory device comprises a vapour cell within which the atomic ensemble is held. Preferably the atomic ensemble, e.g. the vapour cell, is coupled to one or more waveguides, e.g. optical fibers.

Preferably the one or more waveguides (e.g. optical fibers) are coupled to the signal source of electromagnetic radiation and/or the one or more control sources of electromagnetic radiation. This conveniently allows the signal source and the one or more control sources to direct their respective electromagnetic radiation through the one or more waveguides (e.g. optical fibers) so to be incident upon the atomic ensemble.

Furthermore, it will be appreciated that the waveguiding geometry of the one or more waveguides (e.g. optical fibers) used to couple the signal source of electromagnetic radiation and/or the one or more control sources of electromagnetic radiation to the atomic ensemble may help to increase the coupling strength of the incident electromagnetic radiation to the atomic valence electrons in the atomic ensemble. This may help to increase the efficiency of the quantum memory and lower the power of the signal source of electromagnetic radiation and/or the one or more control sources of electromagnetic radiation, thus helping to make the quantum memory device scalable (e.g. to a system comprising a plurality of quantum memory devices, as will be discussed below).

The atomic ensemble may be coupled to the one or more waveguides (e.g. optical fibers) in any suitable and desired way. Preferably the atomic ensemble, e.g. the vapour cell, is integrated into an optical fiber, e.g. having a length of optical fiber extending from one, preferably both, or more sides of the atomic ensemble. This is a particularly convenient way of helping to integrate the atomic ensemble (and thus the quantum memory device) into a larger (e.g. quantum information processing) system.

The atomic ensemble may be integrated within the optical fiber in any suitable and desired way. In a preferred embodiment the optical fiber comprises a hollow (e.g. lattice) core within which the atomic ensemble is held, e.g. the hollow core defines the vapour cell. The hollow core may be any suitable and desired type of hollow core for holding the atomic ensemble. Preferably the hollow core is surrounded by a (e.g. honeycomb or kagome) lattice. In a particularly preferred embodiment the optical fiber comprises a hollow core photonic crystal fiber (e.g. with the hollow core surrounded by a lattice) integrated with (e.g. spliced onto) the (e.g. single mode) optical fiber.

The atomic ensemble may be held at any suitable and desired temperature for operation of the quantum memory device. Preferably the atomic ensemble is arranged at a temperature between 0 degrees centigrade and 200 degrees centigrade, e.g. between 70 degrees centigrade and 100 degrees centigrade. Even at a temperature of 200 degrees centigrade the energy level of the second and third states are preferably still greater than characteristic thermal energy scale, such that there is very little thermal population of these states in the quantum memory device of the present invention. Thus it will be appreciated that no cooling (e.g. using optical pumping) of the atomic ensemble is necessary, which contrasts with the Raman interaction system described in WO 2011/073656 that needs cooling to reduce the thermal noise of the low-lying states used. In addition, these preferred temperatures include a range including and above the melting point of at least some of the alkali metals (rubidium has a melting point of approximately 69 degrees centigrade and caesium has a melting point of approximately 28 degrees centigrade).

Thus in one embodiment the atomic ensemble may be at an ambient, e.g. room, temperature, e.g. between 15 and 25 degrees centigrade, e.g. at approximately 20 degrees centigrade. However, in another embodiment the atomic ensemble is heated, e.g. to between 70 degrees centigrade and 100 degrees centigrade. Thus preferably the quantum memory device comprises a heater in good thermal communication with the atomic ensemble, wherein the heater (e.g. a resistance wire surrounding the atomic ensemble) is arranged to heat the atomic ensemble (e.g. to between 70 degrees centigrade and 100 degrees centigrade). Heating the atomic ensemble helps to increase the number of atoms in the atomic ensemble available for storing the modes of electromagnetic radiation.

Another way to increase the number of atoms in the atomic ensemble available for use in storing the modes of electromagnetic radiation may be to desorb them from the walls of the vapour cell or fiber core, e.g. using light-induced atomic desorption.

The first, second and third states of the atomic valence electrons in the atomic ensemble to be used for the quantum memory device and the atomic transitions therebetween may be any suitable and desired atomic states and atomic transitions. In a preferred embodiment the first state is one of the ground states of the atomic valence electrons in the atomic ensemble. The second state is higher than the first state and the third state is higher than the second state. The first state is (directly) linked to the second state via a (single) atomic transition. The second state is linked to the third state via one or more atomic transitions. The one or more atomic transitions between the second and third states may comprise a plurality of atomic transitions. However in a preferred embodiment the second state is (directly) linked to the third state via a (single) atomic transition.

In a preferred embodiment the first, second and third states have the same principal quantum number. Preferably the first, second and third states have different orbital angular momentum quantum numbers. Preferably the difference in orbital angular momentum quantum number between the first state and the second state is 1. Preferably the difference in orbital angular momentum quantum number between the second state and the third state is 1. Thus, in a particularly preferred embodiment the first state has an orbital angular momentum quantum number of 0 (i.e. an S state). Preferably the second state has an orbital angular momentum quantum number of 1 (i.e. a P state). Preferably the third state has an orbital angular momentum quantum number of 2 (i.e. a D state).

To achieve the required substantial Doppler cancellation between the electromagnetic radiation from the signal source and the one or more control sources (owing to the inverse of the residual Doppler linewidth of the electromagnetic radiation incident upon the atomic ensemble being greater than half the lifetime of the coherent excitation of the transition between the first state and the third state), the electromagnetic radiation from the signal source and the one or more control sources may be arranged in any suitable and desired configuration. Thus, when there are a plurality of control sources, each of the control sources could be arranged to direct their respective electromagnetic radiation towards the atomic ensemble in different directions, e.g. as long as the sum of the momenta of all of the control sources is in a direction that is substantially opposite to the direction of the signal source electromagnetic radiation.

However, in a preferred embodiment, the electromagnetic radiation from the signal source and the electromagnetic radiation from the one or more control sources are arranged to be incident upon the atomic ensemble in substantially opposite directions (thus preferably when there are a plurality of control sources the electromagnetic radiation therefrom is arranged to be incident upon the atomic ensemble in substantially the same direction). Preferably the electromagnetic radiation from the signal source and the electromagnetic radiation from the one or more control sources is arranged to be substantially collinear (albeit in different directions).

Arranging the signal source electromagnetic radiation and the electromagnetic radiation from the one or more control sources to be counter-propagating helps to substantially cancel out any Doppler shifts introduced by the incidence of the electromagnetic radiation from these sources on the atomic ensemble. It will be appreciated that this configuration is technically simple, e.g. because the signal source electromagnetic radiation and the electromagnetic radiation from the one or more control sources may be guided along waveguides either side of the atomic ensemble so to be incident upon the atomic ensemble from opposite directions. The configuration also provides a long interaction volume (e.g. over a length of the atomic ensemble) for the electromagnetic radiation from the signal source and the electromagnetic radiation from the one or more control sources, because the electromagnetic radiation from the signal source and the electromagnetic radiation from the one or more control sources overlap along a line rather than at a single point.

When the signal source electromagnetic radiation and the control sources electromagnetic radiation are counter-propagating, preferably the frequency of the electromagnetic radiation generated by the signal source differs by less than ten percent from the sum of the frequencies of the electromagnetic radiation generated by the one or more control sources. This helps to ensure that the inverse of the residual Doppler linewidth owing to the incidence of the electromagnetic radiation generated by the signal source and the one or more control sources on the atomic valence electrons in the atomic ensemble is greater than half the lifetime of the coherent excitation of the transition between the first state and the third state.

Preferably the inverse of the residual Doppler linewidth owing to the incidence of the electromagnetic radiation generated by the signal source and the one or more control sources on the atomic valence electrons in the atomic ensemble is greater (e.g. two times greater) than the lifetime of the coherent excitation of the transition between the first state and the third state.

Owing to the substantial Doppler cancellation between the electromagnetic radiation from the signal source and the one or more control sources, e.g. owing to the frequency of the electromagnetic radiation generated by the signal source differing by less than ten percent from the sum of the frequencies of the electromagnetic radiation generated by the one or more control sources, preferably the first, second and third states are arranged relative to each other in energy (and therefore frequency) accordingly. Thus preferably (e.g. when the electromagnetic radiation from the signal source and the electromagnetic radiation from the one or more control sources is counter-propagating) the frequency of the transition between the first state and the second state differs by less than ten percent from the frequency of the transition between the second state and the third state, e.g. by less than six percent, e.g. by less than four percent, e.g. by less than two percent.

It will be appreciated that the states and the transitions of the atomic ensemble for use in the quantum memory device of the present invention preferably depend on the composition of (i.e. the type of atoms in) the atomic ensemble such that the signal source electromagnetic radiation and the electromagnetic radiation from the one or more control sources is able to stimulate the off-resonant transitions between the first and second states, and between the second and third states. Thus, depending on the frequencies of the transitions available in the atomic ensemble to be used, the number of the one or more transitions to use from the second state to reach an appropriate third state, for example, may be chosen such that the summed frequency of these states is within ten percent of the transition frequency between the first and second states (e.g. when the electromagnetic radiation from the signal source and the electromagnetic radiation from the one or more control sources is counter-propagating).

In a particularly preferred embodiment the atomic ensemble comprises rubidium atoms; the first state is the 5S state of rubidium, the second state is the 5P state of rubidium and the third state is the 5D state of rubidium. Thus preferably the signal source electromagnetic radiation is arranged to stimulate the 5S to 5P transition of rubidium and the electromagnetic radiation from the one or more control sources is arranged to stimulate the 5P to 5D transition of rubidium. It will be appreciated that the frequency of the 5S to 5P transition in rubidium (of approximately 384 THz or 780 nm) is nearly degenerate with the frequency of the 5P to 5D transition in rubidium (of approximately 386 THz or 776 nm).

As discussed below, when the electromagnetic radiation from the signal source and the electromagnetic radiation from the one or more control sources is counter-propagating, this near degeneracy of the transitions and the frequencies of the electromagnetic radiation incident upon the atomic ensemble helps reduce Doppler dephasing (the detrimental effect of the thermal motion of the atoms on the lifetime) of the coherent excitation between the first and third states. It will be appreciated that other atomic species (other than rubidium) may have states and transitions with similar properties. Therefore corresponding states and transitions having appropriate properties may also be used, as is suitable and desired, e.g. in other alkali metals such as caesium.

Although the transitions and the momenta (and, e.g., the frequencies) of the electromagnetic radiation incident upon the atomic ensemble are close enough to each other to provide, in at least preferred embodiments, advantageous Doppler cancellation, preferably the transition frequencies and the respective frequencies of the electromagnetic radiation incident upon the atomic ensemble are not equal. This separation (and thus lack of overlap) of the transition frequencies again helps to allow the electromagnetic radiation to be incident upon the atomic ensemble to be broadband, because the electromagnetic radiation from each of the sources does not need to have a narrow bandwidth to enable the different transitions (between the first and second states, and the second and third states) to be distinguished, as was the case in the arrangement disclosed in WO 2011/073656.

It will also be appreciated that, e.g. when the electromagnetic radiation from the signal source and the electromagnetic radiation from the one or more control sources is counter-propagating, as well as the transition frequencies and the respective frequencies of the incident electromagnetic radiation preferably not being equal, preferably the frequency of the electromagnetic radiation from the signal source is not equal to the sum of the frequencies of the electromagnetic radiation from the one or more control sources. This difference in frequencies helps to reduce the coupling of the electromagnetic radiation from the one or more control sources to the transition between the first and the second states (and thus the fluorescence of this transition), and similarly to reduce the coupling of the electromagnetic radiation from the signal source to the transition between the second and third states. This lack of cross-coupling thus helps to reduce the fluorescence noise and four-wave mixing of the quantum memory device. Therefore preferably the electromagnetic radiation from the signal source has a frequency that is outside the collisional linewidth of the transition between the second and third states. Preferably also the electromagnetic radiation from the one or more control sources has a summed frequency that is outside the collisional linewidth of the transition between the first and second states.

In a preferred embodiment, e.g. when the electromagnetic radiation from the signal source and the electromagnetic radiation from the one or more control sources is counter-propagating, the difference between the frequency of the electromagnetic radiation from the signal source and the sum of the frequencies of the electromagnetic radiation from the one or more control sources (and thus preferably also the difference in frequencies between the corresponding transitions of the first and second, and second and third states) is (e.g. more than ten times) greater than the frequency by which the electromagnetic radiation from the signal source and/or the sum of the frequencies of the electromagnetic radiation from the one or more control sources is off-resonance (detuned) from the respective transitions they are stimulating.

For example, in the embodiment in which the 5S-5P-5D transitions in rubidium are used, the difference in frequencies between the 5S-5P transition and the 5P-5D transition is approximately 2 THz, which allows a relatively large detuning (e.g. up to 100 GHz, as outlined below) such that broadband sources (and thus short pulses) of electromagnetic radiation are able to be used. Furthermore, this separation of the different transition frequencies helps to ensure that even with relatively large detuning of the incident electromagnetic radiation, there is little risk of any fluorescence noise, e.g. owing to the electromagnetic radiation from the different signal and control sources lying outside the collision-induced fluorescence linewidth of the transitions being used. However, despite this, preferably the frequencies of the incident electromagnetic radiation are close enough to each other to provide the necessary Doppler cancellation.

The (fluorescence) lifetimes of the first state (when not a ground state), the second state and the third state may be any suitable and desired duration. In a preferred embodiment the lifetime of the third state is greater than 10 ns, e.g. greater than 50 ns, e.g. greater than 100 ns, e.g. greater than 200 ns. Preferably the lifetime of the second state is (e.g. significantly) greater than the inverse of the detuning (off-resonance) of the electromagnetic radiation from the signal source and/or the electromagnetic radiation from the one or more control sources.

Although, at least in preferred embodiments, the lifetime of the coherent excitation between the first and third states may be relatively short, it will be appreciated that this may be long enough to store and retrieve one or more modes of electromagnetic radiation in the atomic ensemble, e.g. depending on the rate at which the device is clocked. It will also be appreciated that when the atomic ensemble comprises rubidium atoms and the third state is the 5D state, the lifetime of this state (which is a limiting factor in the lifetime of the coherent excitation) is approximately 240 ns which may be of sufficient length to store and retrieve one or more modes of electromagnetic radiation in the atomic ensemble and may also be long enough to enable multiple quantum memory devices to be synchronised.

Assuming a long-lived first state (e.g. when the first state is a meta-stable state or a ground state), the lifetime of the coherent excitation (e.g. the maximum time for which the one or more modes of electromagnetic radiation from the signal source may be stored in the quantum memory device) is ultimately limited by the spontaneous emission (fluorescence) lifetime of the third state (e.g. when there is substantial Doppler cancellation between the electromagnetic radiation that is incident upon the atomic ensemble, such that Doppler dephasing is suppressed). Thus preferably the lifetime of the third state is greater than the lifetime of the coherent excitation between the first and third states, e.g. two times greater than the lifetime of the coherent excitation between the first and third states.

The signal source of electromagnetic radiation, that is arranged to generate electromagnetic radiation having a frequency corresponding to, and arranged to stimulate, an off-resonant atomic transition between the first state and the second state of atomic valence electrons in the atomic ensemble, may be provided in any suitable and desired way. In a preferred embodiment the signal source of electromagnetic radiation comprises a laser. Thus preferably the laser is arranged to direct the electromagnetic radiation it generates, e.g. along a waveguide (e.g. an optical fiber), to be incident upon the atomic ensemble.

The signal source of electromagnetic radiation may have any suitable and desired frequency that corresponds to an off-resonant atomic transition between the first state and the second state of atomic valence electrons in the atomic ensemble. In a preferred embodiment the frequency of the electromagnetic radiation generated by the signal source is approximately 384 THz or 780 nm (i.e. corresponding to the 5S to 5P transition in rubidium).

As indicated, the frequency of the electromagnetic radiation generated by the signal source is detuned (off-resonant) from the transition between the first state and the second state of the atomic valence electrons in the atomic ensemble. In a preferred embodiment the frequency of the electromagnetic radiation generated by the signal source is detuned (off-resonant) from the frequency of the transition between the first state and the second state of the atomic valence electrons in the atomic ensemble by between 5 GHz and 100 GHz, e.g. approximately 50 GHz. Preferably the detuning of the signal source electromagnetic radiation from the frequency of the transition between the first state and the second state is approximately ten times greater than the bandwidth of the signal source electromagnetic radiation. Also preferably, the detuning of the signal source electromagnetic radiation from the frequency of the transition between the first state and the second state is greater than the Doppler linewidth (e.g. after any Doppler cancellation) and, e.g., the hyperfine splitting.

This detuning from the transition between the first and second states of the electromagnetic radiation from the signal source may allow a bandwidth in the signal source electromagnetic radiation (and thus in the modes of the electromagnetic radiation to be stored in the atomic ensemble) of between 1 MHz and 1.7 THz, e.g. between 100 MHz and 1 THz, e.g. between 1 GHz and 1 THz, e.g. approximately 100 GHz to be accommodated (e.g. corresponding to a pulse duration of approximately 10 ps). Thus in a preferred embodiment the signal source electromagnetic radiation has a bandwidth of between 1 MHz and 1.7 THz, e.g. between 100 MHz and 1 THz, e.g. between 1 GHz and 1 THz, e.g. approximately 100 GHz. This balances the coupling strength between the signal source electromagnetic radiation and the transition between the first and second states required to efficiently store one or more modes of electromagnetic radiation in the atomic ensemble, with the useful bandwidth and pulse duration of the signal source electromagnetic radiation, e.g. to be able to operate at a high enough repetition ("clock") rate such it may enable multiple quantum memory devices to be synchronised.

The signal source of electromagnetic radiation may be arranged to generate electromagnetic radiation to be incident upon the atomic ensemble in any suitable and desired way. In a preferred embodiment the signal source is arranged to generate pulses of electromagnetic radiation. Thus preferably the signal source electromagnetic radiation incident upon the atomic ensemble is pulsed.

Preferably the bandwidth of the pulses of electromagnetic radiation from the signal source of electromagnetic radiation is between 1 MHz and 1.7 THz, e.g. between 100 MHz and 1 THz, e.g. between 1 GHz and 1 THz, e.g. approximately 100 GHz. Preferably the pulses of signal source electromagnetic radiation have a duration between 20 ps and 500 ps, e.g. approximately 50 ps. Providing a short pulse allows the quantum memory device to be operated at a high clock rate, thus helping to enable multiple quantum memory devices to be synchronised. For example, it will be appreciated that such duration pulses may be, at least in preferred embodiments, shorter than the lifetime of the storage state (the lifetime of the coherent excitation between the first and third states) of the atomic ensemble. This may thus allow multiple attempts for the storage and retrieval of one or more modes of electromagnetic radiation in the atomic ensemble within the lifetime of this storage state (e.g. given a suitably high clock rate).

The one or more control sources of electromagnetic radiation, that are each arranged to generate electromagnetic radiation having a frequency corresponding to, and arranged to stimulate, an off-resonant atomic transition from the one or more atomic transitions linking the second state and the third state of atomic valence electrons in the atomic ensemble, may be provided in any suitable and desired way. The one or more control sources of electromagnetic radiation may comprise a plurality of control sources, e.g. corresponding to (and preferably having a one to one match with) a plurality of atomic transitions between the second and third states of the atomic valence electrons in the atomic ensemble.

However preferably the quantum memory device comprises (e.g. only) a (single) control source, e.g. corresponding to a (single) transition between the second and third states. Thus, in a particularly preferred embodiment the quantum memory device comprises a control source of electromagnetic radiation arranged to generate electromagnetic radiation having a frequency corresponding to an off-resonant atomic transition between the second state and the third state of atomic valence electrons in the atomic ensemble, wherein the electromagnetic radiation from the control source is arranged to be incident upon the atomic ensemble to stimulate off-resonant transitions of the atomic valence electrons in the atomic ensemble between the second state and the third state.

In a preferred embodiment the one or more control sources of electromagnetic radiation each comprises a laser. Thus preferably the one or more lasers are each arranged to direct the electromagnetic radiation it generates, e.g. along a waveguide (e.g. an optical fiber), to be incident upon the atomic ensemble.

The one or more control sources of electromagnetic radiation may each have any suitable and desired frequency that corresponds to an off-resonant atomic transition from the one or more atomic transitions between the second state and the third state of atomic valence electrons in the atomic ensemble. In a preferred embodiment the sum of the frequencies of the electromagnetic radiation generated by the one or more control sources (e.g. the frequency of a (single) control source) is approximately 386 THz or 776 nm (i.e. corresponding to the 5P to 5D transition in rubidium).

As indicated, the frequency or the sum of the frequencies of the electromagnetic radiation generated by the one or more control sources is/are detuned (off-resonant) from the transition between the second state and the third state of the atomic valence electrons in the atomic ensemble. In a preferred embodiment the frequency or sum of the frequencies of the electromagnetic radiation generated by the one or more control sources is detuned (off-resonant) from the frequency of the transition between the second state and the third state of the atomic valence electrons in the atomic ensemble by between 5 GHz and 100 GHz, e.g. approximately 50 GHz. Preferably the detuning of the electromagnetic radiation of the one or more control sources from the frequency of the transition between the second state and the third state is approximately ten times the bandwidth of the electromagnetic radiation of, e.g. each of, the one or more control sources.

This may allow a bandwidth in the electromagnetic radiation from each of the one or more control sources (and thus in the modes of the electromagnetic radiation to be stored in the atomic ensemble) of between 1 MHz and 1.7 THz, e.g. between 100 MHz and 1 THz, e.g. between 1 GHz and 1 THz, e.g. approximately 100 GHz to be accommodated (e.g. corresponding to a pulse duration of approximately 10 ps). Thus in a preferred embodiment the electromagnetic radiation from each of the one or more control sources has a bandwidth of between 1 MHz and 1.7 THz, e.g. between 100 MHz and 1 THz, e.g. between 1 GHz and 1 THz, e.g. approximately 100 GHz. This balances the coupling strength between the electromagnetic radiation from the one or more control sources and the one or more transitions between the second and third states required to create the coherent excitation of the transition between the first and third states, with the useful bandwidth and pulse duration of the electromagnetic radiation from each of the one or more control sources, e.g. to be able to operate at a high enough repetition ("clock") rate such it may enable multiple quantum memory devices to be synchronised.

Although the coupling strengths between the electromagnetic radiation from the signal source and/or the one or more control sources, and the respective transitions they are arranged to stimulate are reduced when the frequencies of the electromagnetic radiation are detuned from the resonant frequencies of the respective transitions, this may be able to be compensated by increasing the density of the atomic ensemble. Preferably the density of the atomic ensemble is between $10^{12}$ and $10^{15}$ atoms/cm$^3$ (e.g. when the atomic ensemble comprises a vapour or a gas). Increasing the density of the atomic ensemble may be possible because, at least in preferred embodiments, it may not be necessary to prepare the atomic ensemble using optical pumping. Additionally or alternatively, the intensity of the electromagnetic radiation from the one or more control sources may be increased.

The broadband nature of the signal source and the one or more control sources is considered to be novel and inventive in its own right. Therefore when viewed from a third aspect the invention provides a quantum memory device for storing one or more modes of electromagnetic radiation, the quantum memory device comprising:

an atomic ensemble comprising atomic valence electrons having a first state, a second state and a third state, wherein the second state has a higher energy than, and is linked to, the first state by an atomic transition, and the third state has a higher energy than, and is linked to, the second state by one or more atomic transitions;

a signal source of electromagnetic radiation arranged to generate one or more modes of electromagnetic radiation to be stored having a frequency corresponding to an off-resonant atomic transition between the first state and the second state of atomic valence electrons in the atomic ensemble, wherein the one or more modes of electromagnetic radiation from the signal source are arranged to be incident upon the atomic ensemble to stimulate off-resonant transitions of the atomic valence electrons in the atomic ensemble between the first state and the second state, and wherein the signal source electromagnetic radiation has a bandwidth of greater than 1 GHz;

one or more control sources of electromagnetic radiation each arranged to generate electromagnetic radiation having a frequency corresponding to an off-resonant atomic transition from the one or more atomic transitions linking the second state and the third state of atomic valence electrons in the atomic ensemble, wherein the electromagnetic radiation from the one or more control sources is arranged to be incident upon the atomic ensemble to stimulate off-resonant transitions of the atomic valence electrons in the atomic ensemble between the second state and the third state, and wherein the electromagnetic radiation from each of the one or more control sources has a bandwidth of greater than 1 GHz; and wherein the quantum memory device is arranged such that on incidence of one or more modes of electromagnetic radiation from the signal source and electromagnetic radiation from each of the one or more control sources to the atomic ensemble, a coherent excitation of the transition between the first state and the third state is created that stores the one or more modes of electromagnetic radiation from the signal source in the atomic ensemble, and subsequent incidence of electromagnetic radiation from each of the one or more control sources upon the atomic ensemble stimulates emission of the one or more stored modes of electromagnetic radiation from the atomic ensemble.

When viewed from a fourth aspect the invention provides a method of storing and retrieving one or more modes of electromagnetic radiation in a quantum memory device, the quantum memory device comprising:

an atomic ensemble comprising atomic valence electrons having a first state, a second state and a third state, wherein the second state has a higher energy than, and is linked to, the first state by an atomic transition, and the third state has a higher energy than, and is linked to, the second state by one or more atomic transitions;

the method comprising:

storing one or more modes of electromagnetic radiation in the atomic ensemble by:

stimulating off-resonant transitions of the atomic valence electrons in the atomic ensemble between the first state and the second state by arranging for one or more modes of electromagnetic radiation generated by a signal source of electromagnetic radiation to be incident upon the atomic ensemble, wherein the frequency of the electromagnetic radiation from the signal source corresponds to an off-resonant atomic transition between the first state and the second state of atomic valence electrons in the atomic ensemble, and wherein the signal source electromagnetic radiation has a bandwidth of greater than 1 GHz; and stimulating off-resonant transitions of the atomic valence electrons in the atomic ensemble between the second state and the third state by arranging for electromagnetic radiation generated by one or more control sources of electromagnetic radiation to each be incident upon the atomic ensemble, wherein the frequency of the electromagnetic radiation from the one or more control sources each corresponds to an off-resonant atomic transition from the one or more atomic transitions linking the second state and the third state of atomic valence electrons in the atomic ensemble, and wherein the electromagnetic radiation from each of the one or more control sources has a bandwidth of greater than 1 GHz;

wherein the one or more modes of electromagnetic radiation from the signal source and the electromagnetic radiation from each of the one or more control sources are arranged to be incident upon the atomic ensemble such that a coherent excitation of the transition between the first state and the third state is created that stores the one or more modes of electromagnetic radiation from the signal source in the atomic ensemble; and retrieving the one or more modes of electromagnetic radiation that have been stored in the atomic ensemble by:

further stimulating off-resonant transitions of the atomic valence electrons in the atomic ensemble between the second state and the third state by arranging for electromagnetic radiation generated by one or more control sources of electromagnetic radiation to each be incident upon the atomic ensemble after the one or more modes of electromagnetic radiation generated by the signal source have been stored in the atomic ensemble;

wherein the electromagnetic radiation from each of the one or more control sources is arranged to be incident upon the atomic ensemble to stimulate emission of the one or more stored modes of electromagnetic radiation from the atomic ensemble.

As will be appreciated by those skilled in the art, these aspects of the present invention can, and preferably do, include any one or more or all of the preferred and optional features of the present invention discussed herein, as appropriate. For example, preferably the inverse of the residual Doppler linewidth owing to the incidence of the electromagnetic radiation generated by the signal source and the one or more control sources on the atomic valence electrons in the atomic ensemble is greater than half the lifetime of the coherent excitation of the transition between the first state and the third state.

The one or more control sources of electromagnetic radiation may be arranged to generate electromagnetic radiation to be incident upon the atomic ensemble in any suitable and desired way. In a preferred embodiment the one or more control sources are each arranged to generate pulses of electromagnetic radiation. Thus preferably the electromagnetic radiation from each of the one or more control sources incident upon the atomic ensemble is pulsed.

Preferably the bandwidth of the pulses of electromagnetic radiation from each of the one or more control sources is between 1 MHz and 1.7 THz, e.g. between 100 MHz and 1 THz, e.g. between 1 GHz and 1 THz, e.g. between 10 GHz and 500 GHz, e.g. approximately 100 GHz. Preferably the pulses of electromagnetic radiation from each of the one or more control sources have a duration between 10 ps and 500 ps, e.g. between 20 ps and 400 ps, e.g. approximately 50 ps.

Providing a short pulse allows the quantum memory device to be operated at a high clock rate, thus helping to enable multiple quantum memory devices to be synchronised. For example, it will be appreciated that such duration pulses may be, at least in preferred embodiments, shorter than the lifetime of the storage state (the lifetime of the coherent excitation between the first and third states) of the atomic ensemble. This may thus allow multiple attempts for the storage and retrieval of one or more modes of electromagnetic radiation in the atomic ensemble within the lifetime of this storage state (e.g. given a suitably high clock rate).

Preferably the bandwidth of the pulses of electromagnetic radiation from each of the one or more (e.g. one) control sources is greater than or approximately equal to the bandwidth of the pulses of electromagnetic radiation from the signal source, as this may help to allow the electromagnetic radiation from each of the one or more (e.g. one) control sources to overlap with the electromagnetic radiation from the signal source and thus store the one or more modes of electromagnetic radiation from the signal source in the atomic ensemble.

The (e.g. atomic ensemble of the) quantum memory device is configured such that when the electromagnetic radiation from the signal source and the one or more control sources is incident upon the atomic ensemble, this creates a coherent excitation of the transition between the first state and the third state. Preferably the coherent excitation is resonant with this transition. Thus, although the frequencies of the signal source electromagnetic radiation and the electromagnetic radiation from the one or more control sources are (e.g. each) detuned (off-resonance) from the respective transitions between the first, second and third states they stimulate, preferably together they are resonant with the combined transition between the first and third states (via the off-resonant second state). Thus in a preferred embodiment the sum of the frequencies of the electromagnetic radiation generated by the signal source and the one or more control sources is substantially equal (e.g. having a detuning of less than 500 MHz) to the sum of the frequency of the transition between the first and second states and the frequency of the transition between the second and third states of the atomic valence electrons in the atomic ensemble.

When there is (only) a single control source of electromagnetic radiation, preferably the frequency of the two-photon transition between the first and third states (via the off-resonant second state; e.g. the 5S to 5D transition via the 5P state in rubidium) is substantially equal (e.g. having a detuning of less than 500 MHz) to the sum of the frequency of the electromagnetic radiation generated by the signal source and the frequency of the electromagnetic radiation generated by the control source.

The signal source and the one or more control sources may be arranged relative to each other (and to the atomic ensemble), and arranged to direct their respective electromagnetic radiation that they generate, in any suitable and desired configuration. Owing to the substantial Doppler cancellation of the electromagnetic radiation that is incident upon the atomic ensemble, the frequency of the signal source electromagnetic radiation and the sum of the frequencies of the electromagnetic radiation will be nearly degenerate if the signal source electromagnetic radiation is incident upon the atomic ensemble in substantially the opposite direction to the electromagnetic radiation from the one or more control sources. However, more generally, in a preferred embodiment the direction of the momentum of the electromagnetic radiation generated by the signal source is substantially opposite to the direction of the sum of the momenta of the electromagnetic radiation generated by the one or more control sources.

This substantial balancing of the momenta of the electromagnetic radiation from the signal source and the one or more control sources helps to provide substantial Doppler cancellation owing to the incidence of the electromagnetic radiation from the signal source and the one or more control sources on the atomic ensemble. Thus, when there are a plurality of control sources, each of the control sources could be arranged to direct their respective electromagnetic radiation towards the atomic ensemble in different directions, e.g. as long as the sum of the momenta of all of the control sources is in a direction that is substantially opposite to the direction of the signal source electromagnetic radiation. Alternatively the electromagnetic radiation from each of the control sources may be arranged to be incident upon the atomic ensemble in substantially the same (e.g. collinear) direction (e.g. substantially the opposite direction to the signal source electromagnetic radiation), and thus preferably the frequency of the electromagnetic radiation generated by the signal source differs by less than ten percent from the sum of the frequencies of the electromagnetic radiation generated by the one or more control sources.

When there is only a single control source, preferably the signal source electromagnetic radiation and the control source electromagnetic radiation are arranged to be incident upon the atomic ensemble in substantially opposite directions. Preferably the signal source electromagnetic radiation and the control source electromagnetic radiation is arranged to be substantially collinear (albeit in different directions).

Arranging the signal source electromagnetic radiation and the electromagnetic radiation from the one or more control sources to be counter-propagating helps to reduce, e.g. substantially cancel out, any Doppler shifts introduced by the incidence of the electromagnetic radiation from these sources on the atomic ensemble (e.g. when the atomic ensemble comprises a vapour), that may otherwise cause dephasing of the coherent excitation between the first and third states and thus of the stored modes of electromagnetic radiation. Reducing any Doppler shifts thus helps to avoid having to cool the atomic ensemble and also helps to maintain the two-transition system (the coherent excitation of the first, second and third states). By reducing any Doppler shifts this helps to reduce the dephasing (e.g. of the coherent excitation between the first and third (storage) states) compared to the spontaneous emission lifetime of the state. This thus helps to maximise and exploit the storage time of the modes of electromagnetic radiation in the atomic ensemble as it is primarily limited by the spontaneous emission of the storage state, and also helps to maximise the end to end efficiency of the quantum memory device (e.g. owing to the relatively long length (e.g. limited by the length of the atomic ensemble) over which the electromagnetic radiation from the signal source and the one or more control sources may be able to interact).

Another benefit, in at least preferred embodiments, of the counter-propagating electromagnetic radiation, is that the signal source electromagnetic radiation and the electromagnetic radiation from the one or more control sources is not co-propagating (e.g. as in the arrangement disclosed in WO 2011/073656). This helps to separate the respective electromagnetic radiation from each other, so it may not be necessary to use, e.g. lossy cavity based, filters to isolate the signal source electromagnetic radiation. Again, this may help to maximise the end to end efficiency of the quantum memory device.

The coherent excitation of the transition between the first state and the third state that is created by the incidence of the signal source electromagnetic radiation and the radiation from the one or more control sources is such that the quantum memory device stores one or more modes of electromagnetic radiation from the signal source in the atomic ensemble (i.e. the modes are "written" to the quantum memory). Thus preferably the electromagnetic radiation from the signal source and the one or more control sources are arranged to overlap (e.g. in both space and time) in the atomic ensemble. As will be appreciated, the spatial overlap condition may be trivially satisfied when the electromagnetic radiation from the signal source and the one or more control sources are collinear (and, e.g., counter-propagating).

The one or more modes of electromagnetic radiation from the signal source stored in the atomic ensemble may be any suitable and desired modes. In one embodiment the one or more modes of electromagnetic radiation from the signal source stored in the atomic ensemble comprises a (single) photon or a plurality of photons. In another embodiment the one or more modes of electromagnetic radiation from the signal source stored in the atomic ensemble comprises the absence of a photon (such that when the electromagnetic radiation from the one or more control sources is applied to the atomic ensemble to output the stored modes of electromagnetic radiation, correspondingly the output is the absence of a photon).

The one or more modes of electromagnetic radiation may store any suitable and desired attributes associated with the one or more modes of electromagnetic radiation. The one or more modes of electromagnetic radiation may store one or more of: the (e.g. fixed) polarisation information of the electromagnetic radiation of the signal source, the (e.g. fixed) frequency information of the of the electromagnetic radiation of the signal source, the (e.g. fixed) direction information of the electromagnetic radiation of the signal source and the temporal information of the electromagnetic radiation of the signal source. This may thus allow this information to be encoded in one or more modes (e.g. in a single photon) that is to be stored in the atomic ensemble. Therefore preferably the signal source of electromagnetic radiation is arranged to encode one or more of: the (e.g. fixed) polarisation information of the electromagnetic radiation of the signal source, the (e.g. fixed) frequency information of the of the electromagnetic radiation of the signal source, the (e.g. fixed) direction information of the electromagnetic radiation of the signal source and the temporal information of the electromagnetic radiation of the signal source, in one or more modes of electromagnetic radiation that the signal source generates to be incident upon the atomic ensemble.

The atomic ensemble may be arranged in any suitable and desired way in order to store the one or more modes of electromagnetic radiation from the signal source. For example, the atomic ensemble may be any suitable and desired volume and/or shape. In one embodiment the atomic ensemble has a length (e.g. extending in the direction in which the signal source electromagnetic radiation and/or the electromagnetic radiation from the one or more control sources is incident upon the atomic ensemble) arranged such that the signal source electromagnetic radiation and the electromagnetic radiation from the one or more control sources overlaps over the length of the atomic ensemble. This may help to involve lots of the atoms in the atomic ensemble in the storage of the one or more modes of electromagnetic radiation from the signal source and thus provide a relatively strong interaction and thus a relatively high efficiency for the quantum memory device.

When the signal source electromagnetic radiation and/or the electromagnetic radiation from the one or more control sources comprises pulses of electromagnetic radiation, preferably the atomic ensemble has a length (e.g. extending in the direction in which the signal source electromagnetic radiation and/or the electromagnetic radiation from the one or more control sources is incident upon the atomic ensemble) that is greater (e.g. ten times greater, e.g. one hundred times greater) than the length of the pulses of electromagnetic radiation incident upon the atomic ensemble, preferably when the signal source electromagnetic radiation and the electromagnetic radiation from the one or more control sources are counter-propagating through the atomic ensemble.

This (e.g. a long atomic ensemble compared to the length of the pulses) may allow a plurality of modes (e.g. pulses) of electromagnetic radiation from the signal source to be stored (e.g. simultaneously) in the atomic ensemble, e.g. at a plurality of different positions in (e.g. along the length of) the atomic ensemble. This may thus allow different modes (e.g. pulses) having different arrival times into the atomic ensemble to be stored at different positions in (e.g. along the length of) the atomic ensemble, e.g. the different arrival times map to different positions within the atomic ensemble. The times at which the output modes (e.g. pulses) of electromagnetic radiation are received may then determine the arrival times of the modes that were stored.

It will be appreciated that this mode of operation (i.e. storing multiple modes of electromagnetic radiation simultaneously in the atomic ensemble) may be best facilitated when the atomic ensemble is relatively long and the electromagnetic radiation from the signal source and the one or more control sources are counter-propagating (e.g. collinear), thus giving a relatively long interaction length. This is technically a simple implementation Thus preferably the signal source of electromagnetic radiation and/or the one or more control sources of electromagnetic radiation are each arranged to generate a plurality of pulses of electromagnetic radiation to be incident upon the atomic ensemble, e.g. each as a "train" of pulses. However, it will be appreciated that it may be possible to store a plurality of pulses of electromagnetic radiation from the signal source in the atomic ensemble using only a single pulse of electromagnetic radiation from each of the one or more control sources.

Storing multiple different modes of electromagnetic radiation at multiple different positions in the atomic ensemble may also allow multiple different frequencies (or frequency components) of the electromagnetic radiation from the signal source to be stored in the atomic ensemble. This is particularly applicable in the embodiment in which the signal source of electromagnetic radiation is broadband.

In another embodiment the atomic ensemble has a length (e.g. extending in the direction in which the signal source electromagnetic radiation and/or the electromagnetic radiation from the one or more control sources is incident upon the atomic ensemble) that is less than the length of the pulses of electromagnetic radiation incident upon the atomic ensemble (e.g. by a ratio of between 0.1 and less than 1), preferably when the signal source electromagnetic radiation and the electromagnetic radiation from the one or more control sources are counter-propagating through the atomic ensemble. In this embodiment the atomic ensemble is preferably arranged to store a single mode of electromagnetic radiation.

This "short" atomic ensemble may be arranged to operate as a "mode selective" memory. For example, the atomic ensemble may be arranged only to store particular shapes of pulses of electromagnetic radiation from the signal source. Preferably the electromagnetic radiation from the one or more control sources is shaped to determine which shapes of pulses of electromagnetic radiation from the signal source are able to be stored. Other shapes may then simply pass straight through the atomic ensemble. The pulses of the electromagnetic radiation from the one or more control sources that are used to output the stored modes of electromagnetic radiation may also be shaped and/or have their frequency chosen, e.g. to change the shape and/or frequency of the modes of electromagnetic radiation output from the atomic ensemble. This may allow the atomic ensemble to be used as a "mode selective drop filter".

After a storage time (e.g. less than the lifetime of the coherent excitation between the first and third states), the subsequent application of electromagnetic radiation from the one or more control sources to be incident upon the atomic ensemble causes the stored modes of electromagnetic radiation to be output from the atomic ensemble (i.e. the modes are "read" from the quantum memory). The one or more control sources may be arranged in any suitable and desired way to cause the output of the stored modes of electromagnetic radiation from the atomic ensemble.

Thus preferably the subsequent electromagnetic radiation from the one or more control sources is arranged to be incident upon the atomic ensemble within the lifetime of the coherent excitation between the first and third states (after the one or more modes of electromagnetic radiation from the signal source has been stored in the atomic ensemble). For example, the clock (repetition) rate of the (pulses of) electromagnetic radiation from the one or more control sources may be any suitable and desired rate, e.g. compared to the clock rate of the (pulses of) electromagnetic radiation from the signal source (i.e. the rate at modes of electromagnetic radiation are attempted to be stored). In a preferred embodiment the clock rate of the (pulses of) electromagnetic radiation from the one or more control sources is less than the clock rate of the (pulses of) electromagnetic radiation from the signal source.

Preferably the clock rate of the (pulses of) electromagnetic radiation from the one or more control sources and/or the clock rate of the (pulses of) electromagnetic radiation from the signal source has a time period (i.e. the inverse of the clock rate) that is (e.g. significantly (e.g. ten times, e.g. one hundred times)) less than the lifetime of the coherent excitation between the first and third states. This helps to ensure that the stored modes of electromagnetic radiation are read out before the spontaneous emission of the third state. (Alternatively expressed, preferably the time bandwidth product of the (e.g. pulses of) electromagnetic radiation from the signal source and the (e.g. pulses of) electromagnetic radiation from the one or more control sources is (e.g. significantly (e.g. ten times, e.g. one hundred times)) greater than 1.)

Preferably the clock rate of the (pulses of) electromagnetic radiation from the one or more control sources and/or the clock rate of the (pulses of) electromagnetic radiation from the signal source is greater than 50 MHz, e.g. greater than 200 MHz, e.g. greater than 1 GHz, e.g. approximately 80 MHz. It will be appreciated that this gives a time period significantly less than a lifetime of the coherent excitation between the first and third states of, e.g., 100 ns or more (e.g. as in the 5S-5P-5D ladder of transitions in rubidium).

It will be appreciated that the output of the one or more modes of electromagnetic radiation that were stored in the atomic ensemble will generally be in the opposite direction to that in which the (e.g. resultant momentum of the) electromagnetic radiation from the one or more control sources was incident upon the atomic ensemble, owing to phase matching (momentum conservation) considerations.

The quantum memory device of the present invention may be provided as a single device, e.g. as part of a quantum information processing system. However it will be appreciated that a plurality of quantum memory devices according to the present invention may be provided together in a system, e.g. as part of a quantum information processing system. Therefore the invention extends to a (e.g. quantum information processing) system comprising a plurality of quantum memory devices according to the present invention. Preferably the system comprises an array of quantum memory devices according to the present invention, e.g. with each quantum memory device in the system being coupled to at least one other quantum memory device in the system.

Providing such a system containing multiple quantum memory devices is aided, in at least preferred embodiments, by the technical simplicity of each of the quantum memory devices (e.g. as a vapour cell integrated into an optical fiber) and their ability to operate substantially without noise and may not require cryogenic cooling or optical pumping.

When a system comprising a plurality of quantum memory devices is provided, each quantum memory device in the system may have its own signal source of electromagnetic radiation and its own one or more control sources of electromagnetic radiation. However in a preferred embodiment the system comprises a common signal source of electromagnetic radiation that is arranged to generate electromagnetic radiation to be incident upon the atomic ensemble of each of the quantum memory devices in the system. Also preferably the system comprises a common one or more control sources of electromagnetic radiation that is arranged to generate electromagnetic radiation to be incident upon the atomic ensemble of each of the quantum memory devices in the system.

Thus preferably the electromagnetic radiation generated by the common signal source and/or the common one or more control sources is split into a plurality of components, wherein the plurality of components of the electromagnetic radiation are each arranged to be incident upon one of the plurality of atomic ensembles in the system.

Such that the plurality of quantum memory devices in the system may be exploited to their full effect, preferably the plurality of quantum memory devices in the system are synchronised with each other. Preferably this is achieved, as described above, by operating each of the quantum memory devices at a clock rate that is faster than the lifetime of the coherent excitation between the first and third states in the atomic ensemble.

An embodiment of the invention will now be described, by way of example only, with reference to the accompanying drawings, in which.

FIGS. 4a, 4b and 4c show schematically a quantum memory device according to an embodiment of the present invention; and FIGS. 5a, 5b, 5c and 5d are graphs showing various attributes of the fields used in the quantum memory device shown in FIGS. 4a, 4b and 4c to assess its performance.

A preferred embodiment of the quantum memory device of the present invention will now be described, that allows one or more modes of electromagnetic radiation to be stored in an atomic ensemble. A quantum memory is an important part of a quantum information processing system, e.g. a quantum computer. When implemented using photons, a quantum memory provides an interface between light and matter that allows for the storage and retrieval of photonic quantum information, e.g. the quantum state of the stored photons.

Figure 1:
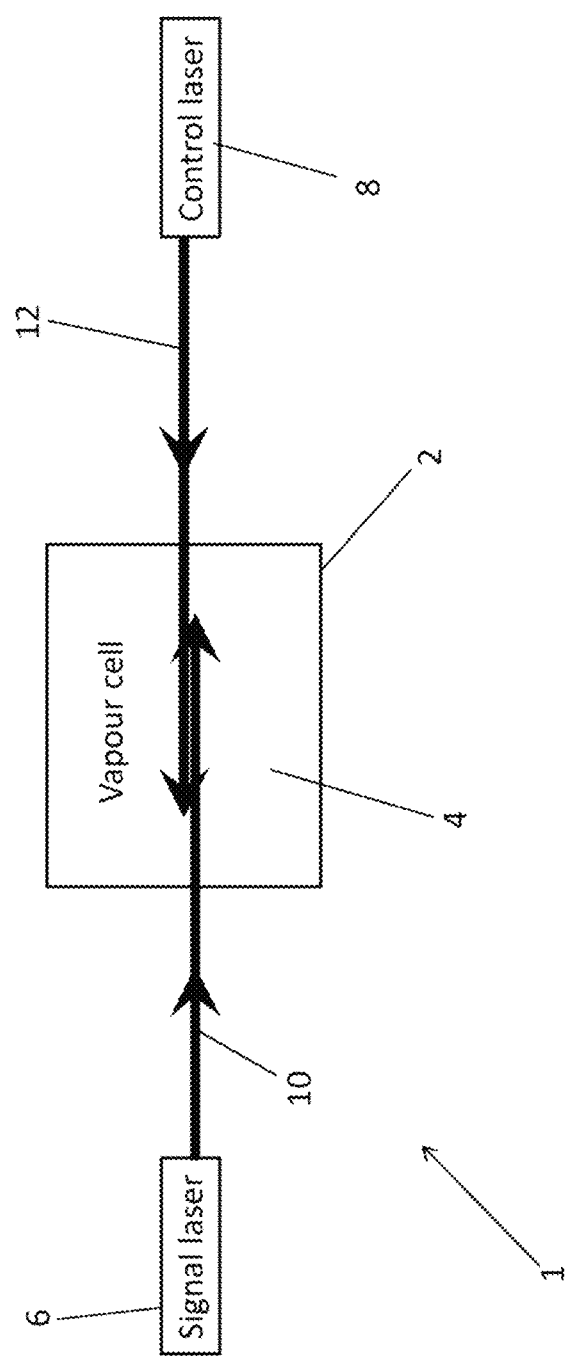
FIG. 1 is a diagram showing schematically a quantum memory device according to an embodiment of the present invention.

FIG. 1 is a diagram showing schematically a quantum memory device 1 according to an embodiment of the present invention. The quantum memory device 1 includes a vapour cell 2 containing an atomic ensemble 4, e.g. of rubidium or caesium atoms. The quantum memory device 1 also includes a signal laser 6 and a control laser 8 that act as sources of pulsed optical or near-infrared radiation 10, 12 to be incident upon the atomic ensemble 4 within the vapour cell 2.

Figure 2:
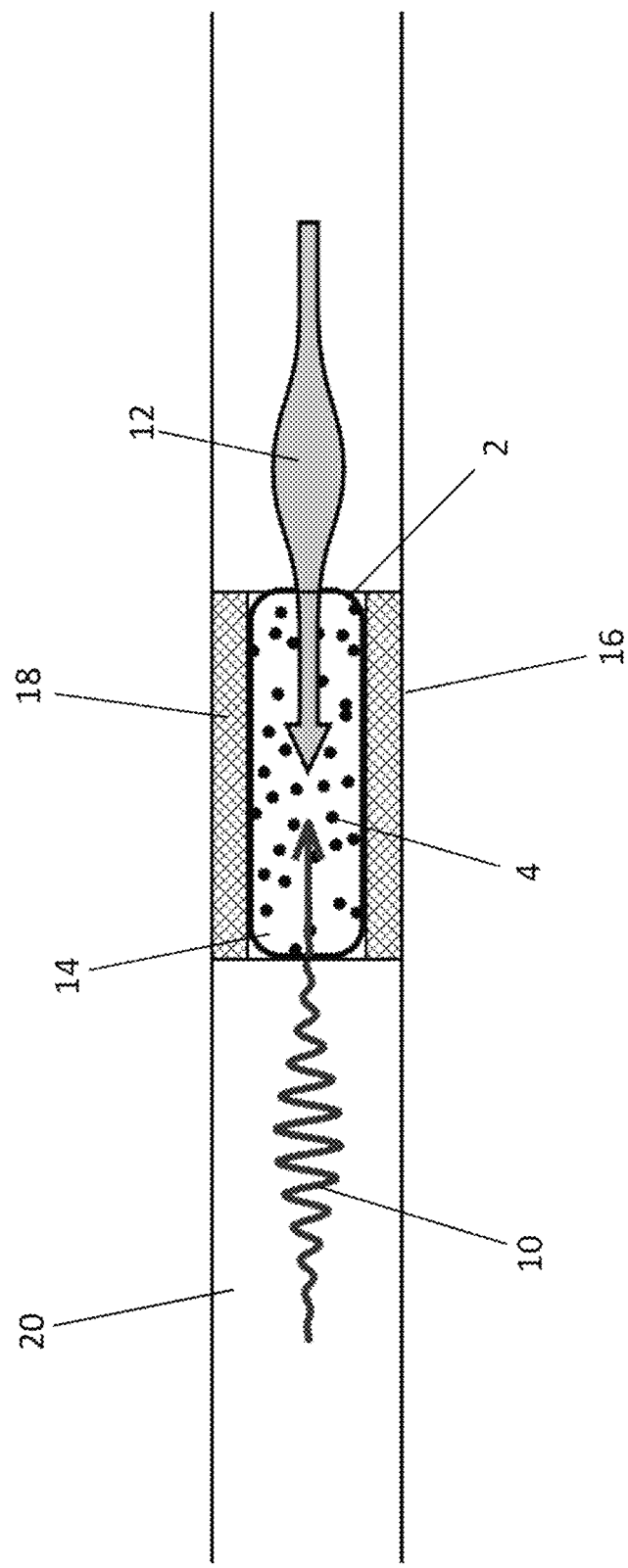
FIG. 2 is a diagram showing schematically a vapour cell for use in the quantum memory device of FIG. 1.

FIG. 2 shows the vapour cell 2 shown in FIG. 1 in more detail. The vapour cell 2 is formed as a hollow core 14 that contains the atomic ensemble 4 within a photonic crystal fiber 16 having a lattice 18 surrounding the hollow core 14. The photonic crystal fiber 16 containing the hollow core 14 is spliced into an optical fiber 20. The optical fiber 20 is connected at either end to the signal and control lasers 6, 8 to enable them to direct their radiation 10, 12 so to be incident upon the atomic ensemble 4 with the vapour cell 2.

Figure 3:
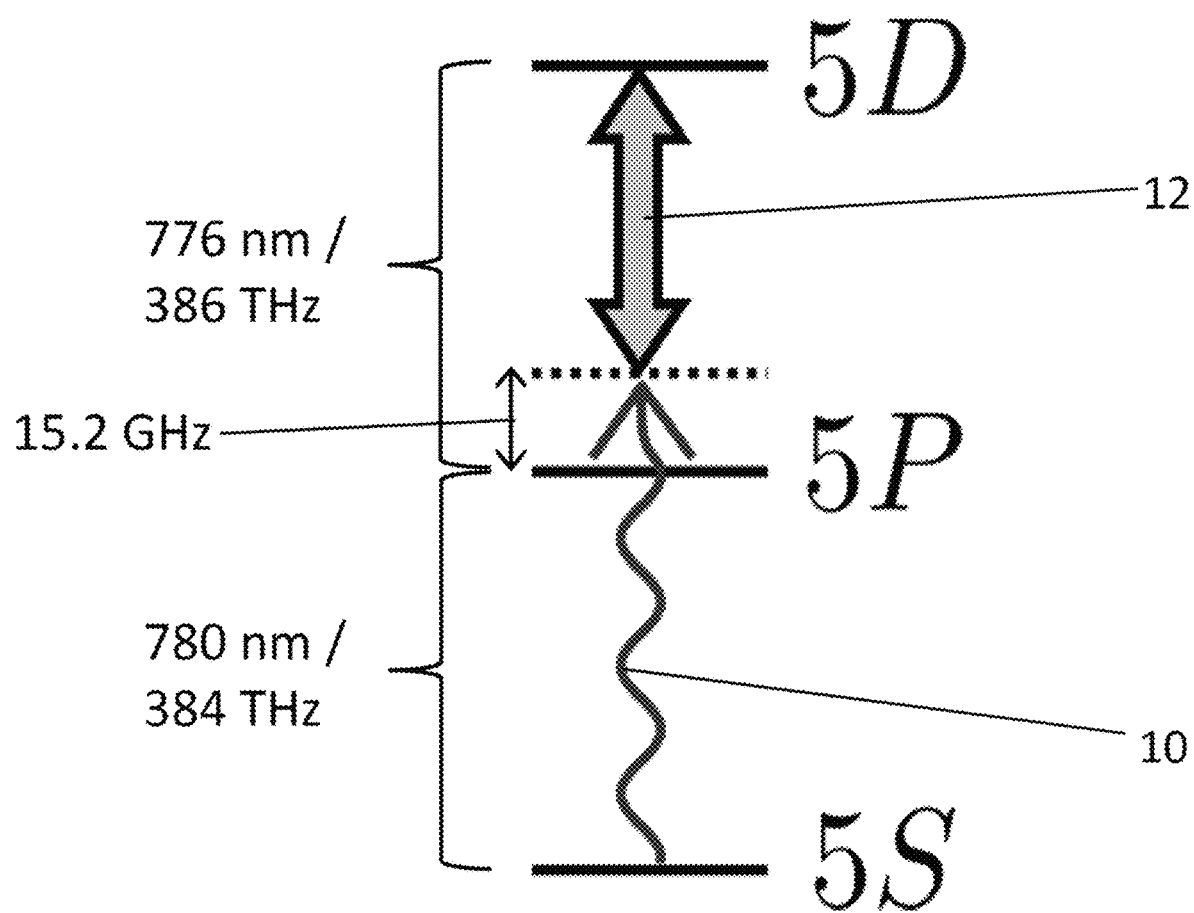
FIG. 3 shows an atomic level scheme used in a quantum memory device according to an embodiment of the present invention.

Operation of the quantum memory device 1 shown in FIGS. 1 and 2 will now be described with reference to FIG. 3. FIG. 3 shows a specific example of an atomic level scheme used in the quantum memory device shown in FIG. 1, when the vapour cell contains an atomic ensemble of rubidium atoms.

The optical fiber 20 is prepared with the crystal fiber 16 spliced into it and containing an atomic ensemble 4 of rubidium atoms in the hollow core 14 of the crystal fiber 16 that forms the vapour cell 2. The optical fiber 20 is connected between the signal laser 6 having a wavelength of 780 nm (corresponding to a frequency of 384 THz) and the control laser 8 having a wavelength of 776 nm (corresponding to a frequency of 386 THz).

The electromagnetic radiation 10 generated by the signal laser 6 is thus arranged to stimulate the 780 nm 5S-5P transition of the atomic valence electrons in the rubidium atomic ensemble 4, and the electromagnetic radiation 12 generated by the control laser 8 is arranged to stimulate the 776 nm 5P-5D transition of the atomic valence electrons in the rubidium atomic ensemble 4. However, the electromagnetic radiation 10, 12 generated by the signal and control lasers 6, 8 respectively is arranged to be detuned from the 5S-5P and 5P-5D transitions respectively by 15.2 GHz, but such that the combined application of the electromagnetic radiation 10, 12 from the signal and control lasers 6, 8 is resonant with the two-photon 5S-5D transition.

The signal laser 6 is arranged to generate 400 ps duration pulses of electromagnetic radiation 10 having a bandwidth of 1 GHz at a rate of 80 MHz. The control laser 8 is arranged to generate 400 ps duration pulses of electromagnetic radiation 12 having a bandwidth of 1 GHz at a rate of 80 MHz. It will be appreciated that the detuning of electromagnetic radiation 10, 12 from the transitions they are arranged to stimulate allows the electromagnetic radiation incident upon the atomic ensemble 4 to have a relatively large bandwidth and therefore short pulse duration. This in turn allows fast operation (i.e. high clock rate) of the quantum memory device 1.

The train of pulses from the signal and control lasers 6, 8 are input through either ends of the optical fiber 20 so to be incident upon the rubidium atomic ensemble 4 in the vapour cell 2. The pulses from the signal laser 6 are arranged to encode modes of electromagnetic radiation 10 therein.

Incidence of the pulses of electromagnetic radiation 10 from the signal laser 6 on the rubidium atomic ensemble 4 stimulates the 5S-5P transition and contemporaneous incidence of the pulses of electromagnetic radiation 12 from the control laser 8 on the rubidium atomic ensemble 4 stimulates the 5P-5D transition. This generates a coherent excitation of the two-photon 5S-5D transition, thus storing the modes of the electromagnetic radiation 10 that were encoded in the pulses from the signal laser 6 in the rubidium atomic ensemble 4. It will be appreciated that owing to the counter-propagation of the pulses of electromagnetic radiation 10 from the signal laser 6 and the pulses of electromagnetic radiation 12 from the control laser 8 incident on the atomic ensemble, any Doppler shift is substantially cancelled, owing to the similar frequencies of the electromagnetic radiation 10 from the signal laser 6 and the electromagnetic radiation 12 from the control laser 8.

Subsequent pulses of the electromagnetic radiation 12 from the control laser 8 on the rubidium atomic ensemble 4 stimulates the 5P-5D transition, causing the emission of the stored modes of the signal electromagnetic radiation 10 from the atomic ensemble 4. Owing to phase matching, the output pulses are emitted from the atomic ensemble 4 in the opposite direction from the input of the pulses of electromagnetic radiation 12 from the control laser 8.

The lifetime of the 5D state in the rubidium atomic ensemble 4 is approximately 240 ns, thus giving a lifetime for the coherent 5S-5D excitation of up to 500 ns (depending on the sources of broadening), which is sufficiently long enough, given a clock rate of 80 MHz for the pulses of electromagnetic radiation 12 from the control laser 8, to be able to read out the modes of electromagnetic radiation 10 from the signal laser 6 that have been stored in the atomic ensemble 4.

FIGS. 4a, 4b and 4c show a more detailed schematic of a quantum memory device 21 according to an embodiment of the present invention, similar to the embodiment shown in FIGS. 1 and 2.

As shown in FIG. 4b, the quantum memory device 21 is centred on a warm caesium vapour cell 22. The caesium vapour cell 22 is interfaced with a 1 GHz bandwidth heralded single-photon source based on type-II parametric down-conversion (PDC). FIG. 4a shows the heralded single-photon source 23 which comprises a pump, a periodically poled potassium titanyl phosphate waveguide 26, a set of Fabry-Perot (FP) etalons 28 and a polarising beam splitter (PBS) 30.

Photon pairs are generated in parametric down-conversion (PDC) by converting a "pump" field 24 into pairs of photons which are in turn filtered by the set of Fabry-Perot (FP) etalons 28 (the pump field 24 is pumped at a rate of 80 MHz from an actively mode-locked titanium sapphire laser, synchronised to the control and frequency doubled, with about a 0.8% chance of producing a photon pair of the correct bandwidth per pump pulse). The heralded single-photon source 23 generates THz-bandwidth pairs of signal and idler photons, both of which are consequently filtered down to about 1 GHz bandwidth (the quantum memory device's signal frequency) using a series of Fabry-Perot etalons 28 and grating filters. In the low-gain regime, when the pair production rate is low, the detection of a photon in one of the modes ("idler" photon (i)) heralds the presence of another ("signal" photon (s)). The signal (s) and idler (i) photons are separated by the polarising beam-splitter (PBS) 30.

The idler photons (i) are detected with a single-photon avalanche photodiode detector ($D_i$), and the signal photons are sent to the caesium vapour cell 22. The heralding efficiency before the signal photons (s) are sent to the caesium vapour cell 22 is $\eta_{herald} \approx 5\%$.

The caesium vapour cell 22 is a 72 mm long uncoated glass cell filled with pure caesium-133 heated to approximately 91° C. The caesium vapour cell 22 includes dichroic mirrors (DM) at each end, which are used to combine the signal field 32 with a bright, counter-propagating control field 34 inside the caesium vapour cell 22. The control field 34 is used to read in and read out the signal field 32 into the quantum "memory" of the caesium vapour cell 22. The output signal field 36 is transmitted from the caesium vapour cell 22 and sent to a detection stage 38.

The 852 nm caesium D2 line is used for the signal field 32, with $6S_{1/2}(F=4)$ as the ground state and the $6P_{3/2}(F=3, 4, 5)$ manifold as the intermediate state. The strong 917 nm control field 34 then couples this signal to the storage state, i.e. the $6D_{5/2}(F=2, 3, 4, 5, 6)$ manifold. Such a complex atomic structure can be reduced to an effective three-level system (i.e. just the $6S_{1/2}$, $6P_{3/2}$ and $6D_{5/2}$ states) in the case of broadband excitation. Both the signal and control fields 32, 34 are detuned by 6 GHz from the intermediate state towards the ground state (i.e. in the opposite direction to that shown in the embodiment of FIG. 3), as this offers both good coupling and negligible linear absorption of the signal.

The control field 34 is derived from an actively mode-locked titanium sapphire laser, locked in repetition rate to 80 MHz, with a bandwidth of approximately 1 GHz, corresponding to a pulse duration of approximately 440 ps. To investigate storage times less than 12.5 ns, i.e. smaller than the time between consecutive pulses from the laser, an unbalanced Mach-Zehnder interferometer is used, with a variable delay in one arm to split the control pulse train into two and delay the pulse trains with respect to each other.

As shown in FIG. 4b, the signal and counter-propagating control fields 32, 34 are combined on the dichroic mirror (DM). Both beams are focused down have a waist of approximately 300 µm and they temporally overlapped inside the caesium vapour cell 22. The memory efficiency for spontaneous parametric down-conversion photons is found to be maximised for read-in and read-out control pulse energies of 0.21(1) and 0.97(1) nJ, respectively.

The signal photons (s) are stored in the caesium vapour cell 22 for approximately 3.5 ns, which is found to be about three orders of magnitude longer than previously known techniques for storing PDC photons in room temperature quantum memories. Furthermore, without the need to prepare the storage state, and given the 5.4 ns memory lifetime in caesium, the quantum memory device 21 is able to be operated at a repetition rate of 80 MHz.

After the signal field 32 is output from the caesium vapour cell 22, it is sent into a Hanbury-Brown-Twiss type setup, as shown in FIG. 4c. The output stage 38 comprises a balanced beam-splitter (BS) and two fiber-coupled single-photon silicon avalanche photodiode detectors ($D_{s1}$ $D_{s2}$) connected to a time-to-digital converter (i.e. the same as the idler detector shown in FIG. 4a). This enables the quantum statistics of the stored and retrieved signal fields to be measured.

FIGS. 5a, 5b, 5c and 5d are graphs showing various attributes of the fields used in the quantum memory device shown in FIGS. 4a, 4b and 4c to assess its performance for the storage of single photons.

FIG. 5a shows a section of the arrival time trace for the combined detectors $D_{s1}$ and $D_{s2}$ with the control field 34 off ("SIG") and on ("MEM"). "SIG" is the signal field 32 with the control field off and "MEM" is the signal field 32 with the control on, for a storage time of 3.5 ns. The "CTRL" setting shown in FIG. 5a corresponds to the control field being on, but with no input signal, and thus shows the noise from the quantum memory device 21. Any photons detected in the "CTRL" configuration would correspond to noise generated by the memory itself.

A convenient metric to measure the noise performance of optical quantum memories is $\mu_1 = \langle n^{noise} \rangle / \eta$, i.e. the ratio of the average number of noise photons per control pulse $\langle n^{noise} \rangle$ and the memory efficiency $\eta$. For the quantum memory device 21 shown in FIGS. 4a, 4b and 4c, this returns a value of $\mu_1 \leq (39.4 \pm 0.2) \times 10^{-6}$ this being, to the knowledge of the Applicant, the lowest ever reported. It should be noted that this is an upper estimate, as the measured noise is upper-bounded by the technical noise (dark counts) of the detectors.

FIG. 5b shows the combined correlation trace between detectors $D_i$ & $D_{s1}$ and $D_i$ & $D_{s2}$, with the control field 34 off ("SIG") and on ("MEM"). The ratio between the main peak and the small side peak at −12.5 ns, or the so-called coincidences-to-accidentals ratio (CAR), in the present case is around 130, demonstrating good quality heralded single photons from the source. The peaks at 12.5 ns and 16 ns come from the next series of read-in and read-out pulses of the 80 MHz pulse train hitting the memory and reading out residual coherence from the atoms.

To verify the quantum performance of the quantum memory device 21 shown in FIGS. 4a, 4b and 4c the photon statistics of the retrieved signal are measured and compared with the single photons sent into the memory. FIG. 5b shows the detected coincidence clicks between the detectors $D_i$ and $D_{s1/2}$ at different times with the control off ("SIG") and on ("MEM"). First, the cross-correlation function $g^{(1,1)}$ of the signal and idler photons is evaluated.

$g^{(1,1)}$ is defined as $g^{(1,1)} = p_{si}/p_s p_i$ where $p_{si}$ is the probability for a signal-idler coincidence click, and $p_{s(i)}$ the signal (idler) click probability. Values of $g^{(1,1)} > 2$ signify non-classical correlations. To calculate $g^{(1,1)}$ from the measurements, the following relationship is used:

$$g^{(1,1)} = \frac{R_{s,i}}{R_s R_i} R_T$$

where $R_{s,i}$ is the sum of $D_i$–$D_{s1}$ and $D_i$–$D_{s2}$ coincidences, $R_T$ is the number of trigger events (i.e. the number of measurements), $R_s$ is the sum of $D_{s1}$ and $D_{s2}$ clicks, and $R_i$ is the number of $D_i$ clicks.

For the quantum memory device 21 shown in FIGS. 4a, 4b and 4c, $g^{(1,1)}$ is measured to be $g^{(1,1)} = 131.3 \pm 0.2$ for the input signal field, and after storage and retrieval $g^{(1,1)} = 120.0 \pm 0.1$ is obtained, clearly exceeding the classical bound of $g_{classical}^{(1,1)} \leq 2$. The reduction in the read-out bin is attributed to dark contamination. Nevertheless, this demonstrates that the quantum memory device 21 shown in FIGS. 4a, 4b and 4c preserves the non-classical correlations between the signal and idler photon numbers.

FIG. 5c shows the coincidences between the different detectors $D_i$, $D_{s1}$ and $D_{s2}$ for the input signal field. $R_{trip}$ is the triple coincidence trace between detectors $D_i$, $D_{s1}$ and $D_{s2}$. $R_{s1,i} R_{s2,i}/R_i$ is the product of the two-fold coincidences between the idler and signal detectors, normalised by the idler counts, i.e. the predicted triple coincidence trace for coherent light of the same average photon rate as the PDC.

FIG. 5d shows the same coincidences as FIG. 5c but for the retrieved field. The retrieved pulse is longer than the input owing to a small mismatch between the signal and control bandwidths.

The ratio of the $R_{trip}$ histogram and the $R_{s1,i} R_{s2,i}/R_i$ histogram is the observed heralded auto-correlation function $g_h^{(2)}$, which is another benchmark of quantum performance.

The heralded auto-correlation function is defined as $g_h^{(2)} = p_{(s1,s2|i)}/p_{(s1|i)} p_{(s2|i)}$, where $p_{(s1,s2|i)}$ is the probability of detecting a coincidence between the detectors $D_{s1}$ and $D_{s2}$ conditioned on a click in the detector $D_i$ and $p_{(s1|i)}$ and $p_{(s1|i)}$ are the probabilities to detect a click in $D_{s1}$ and $D_{s2}$ respectively given a click in $D_i$.

Any $g_h^{(2)} \leq 1$ verifies non-classical photon-number statistics. $g_h^{(2)}$ is evaluated using $$g_h^{(2)} = \frac{R_{trip}}{R_{s1,i} R_{s2,i}} R_i$$

where $R_{trip}$ is the number of triple coincidences between $D_i$, $D_{s1}$ and $D_{s2}$, $R_i$ is the number of idler clicks, and $R_{s1,i}$ and $R_{s2,i}$ are the number of $D_i$–$D_{s1}$ and $D_i$–$D_{s2}$ coincidences respectively.

A value of $g_h^{(2)} < 1$ is a direct measure of anti-bunched photon statistics, with $g_h^{(2)} = 0$ corresponding to a perfect single photon. FIGS. 5c and 5d show the clearly anti-bunched nature of the input and retrieved fields. $g_h^{(2)}$ for the input field is measured to be 0.020±0.005, well below the classical boundary of 1, as expected from low-gain PDC. The heralded auto-correlation function of the retrieved light, is measured as $g_h^{(2)} = 0.028 \pm 0.009$. This is 108 standard deviations below the classical limit. To the Applicant's knowledge, this is the lowest ever measured from a room-temperature quantum memory device. The agreement between input and output $g_h^{(2)}$ confirms that the memory adds substantially no noise.

It can be seen from the above that in at least preferred embodiments the invention provides a quantum memory device that, owing to the ladder structure of the states of the atomic ensemble that are used, and with the input electromagnetic radiation being detuned from an intermediate state but setting up a two (or more) photon resonance, requires no cooling (and so may be able to operate at ambient temperatures), no pumping to prepare the initial state or to empty the storage state, is fast, is able to use broadband electromagnetic radiation, is integrated into optical fibers and so is technically simple, has no collisional fluorescence, no four-wave mixing noise and no bandwidth limit from the splitting of near-degenerate (e.g. ground) states.

The quantum memory device may also provide a relatively long (e.g. greater than 100 ns in principle) storage time (compared to the clock rate of the device), a high efficiency, e.g. owing to it being possible for the atomic ensemble to have a relatively high density, and the ability to store multiple modes of electromagnetic radiation.

Being able to operate at a high clock rate (e.g. compared to the storage time of the device) may allow an increased number of computational cycles (and, e.g., synchronised between multiple devices) to be performed within the quantum decoherence time limit. This may help to allow a robust, fast quantum memory device to be provided, for use in quantum information processing systems, e.g. with high data transfer rates in secure quantum networks.

The invention claimed is:

1. A quantum memory device for storing one or more modes of electromagnetic radiation, the quantum memory device comprising:
an atomic ensemble comprising atomic valence electrons having a first state, a second state and a third state, wherein the second state has a higher energy than, and is linked to, the first state by an atomic transition, and the third state has a higher energy than, and is linked to, the second state by one or more atomic transitions;
a signal source of electromagnetic radiation arranged to generate one or more modes of electromagnetic radiation to be stored having a frequency corresponding to an off-resonant atomic transition between the first state and the second state of atomic valence electrons in the atomic ensemble, wherein the one or more modes of electromagnetic radiation from the signal source are arranged to be incident upon the atomic ensemble to stimulate off-resonant transitions of the atomic valence electrons in the atomic ensemble between the first state and the second state, and wherein the signal source electromagnetic radiation has a bandwidth of greater than 1 GHz;
one or more control sources of electromagnetic radiation each arranged to generate electromagnetic radiation having a frequency corresponding to an off-resonant atomic transition from the one or more atomic transitions linking the second state and the third state of atomic valence electrons in the atomic ensemble, wherein the electromagnetic radiation from the one or more control sources is arranged to be incident upon the atomic ensemble to stimulate off-resonant transitions of the atomic valence electrons in the atomic ensemble between the second state and the third state, and wherein the electromagnetic radiation from each of the one or more control sources has a bandwidth of greater than 1 GHz; and
wherein the quantum memory device is arranged such that on incidence of one or more modes of electromagnetic radiation from the signal source and electromagnetic radiation from each of the one or more control sources to the atomic ensemble, a coherent excitation of the transition between the first state and the third state is created that stores the one or more modes of electromagnetic radiation from the signal source in the atomic ensemble, and subsequent incidence of electromagnetic radiation from each of the one or more control sources upon the atomic ensemble stimulates emission of the one or more stored modes of electromagnetic radiation from the atomic ensemble.

2. The quantum memory device as claimed in claim 1, wherein the atomic ensemble comprises rubidium atoms.

3. The quantum memory device as claimed in claim 1, wherein the quantum memory device comprises a vapor cell within which the atomic ensemble is held.

4. The quantum memory device as claimed in claim 1, wherein the atomic ensemble is coupled to one or more waveguides, wherein the one or more waveguides are coupled to the signal source of electromagnetic radiation or the one or more control sources of electromagnetic radiation such that the electromagnetic radiation from the signal source or the one or more control sources is incident upon the atomic ensemble via the respective one or more waveguides.

5. The quantum memory device as claimed in claim 1, wherein the atomic ensemble is integrated into an optical fiber.

6. The quantum memory device as claimed in claim 5, wherein the optical fibre comprises a hollow core within which the atomic ensemble is held or wherein the optical fibre comprises a hollow core photonic crystal fiber integrated with the optical fibre.

7. The quantum memory device as claimed in claim 1, wherein the electromagnetic radiation from the signal source has a frequency that is outside the collisional linewidth of the transition between the second and third states, or the electromagnetic radiation from the one or more control sources has a summed frequency that is outside the collisional linewidth of the transition between the first and second states.

8. The quantum memory device as claimed in claim 1, wherein the frequency of the electromagnetic radiation generated by the signal source is off-resonant from the frequency of the transition between the first state and the second state by approximately ten times the bandwidth of the electromagnetic radiation generated by the signal source, or the sum of the frequencies of the electromagnetic radiation generated by the one or more control sources is off-resonant from the frequency of the transition between the first state and the second state by approximately ten times the bandwidth of the electromagnetic radiation generated by the one or more control sources.

9. The quantum memory device as claimed in claim 1, wherein the sum of the frequencies of the electromagnetic radiation generated by the signal source and the one or more control sources is substantially equal to the sum of the frequency of the transition between the first and second states and the frequency of the transition between the second and third states of the atomic valence electrons in the atomic ensemble.

10. The quantum memory device as claimed in claim 1, wherein the electromagnetic radiation from the signal source and the electromagnetic radiation from the one or more control sources are arranged to be incident upon the atomic ensemble in substantially opposite directions.

11. The quantum memory device as claimed in claim 10, wherein the frequency of the electromagnetic radiation generated by the signal source differs by less than ten percent from the sum of the frequencies of the electromagnetic radiation generated by the one or more control sources or wherein the difference between the frequency of the electromagnetic radiation from the signal source and the sum of the frequencies of the electromagnetic radiation from the one or more control sources is greater than the frequency by which the electromagnetic radiation from the signal source or the sum of the frequencies of the electromagnetic radiation from the one or more control sources is off-resonance from the respective transitions they are stimulating.

12. The quantum memory device as claimed in claim 1, wherein the signal source of electromagnetic radiation is arranged to encode one or more of: the polarisation information of the electromagnetic radiation of the signal source, the frequency information of the of the electromagnetic radiation of the signal source, the direction information of the electromagnetic radiation of the signal source and the temporal information of the electromagnetic radiation of the signal source, in one or more modes of electromagnetic radiation that the signal source generates to be incident upon the atomic ensemble.

13. The quantum memory device as claimed in claim 1, wherein the signal source of electromagnetic radiation or the one or more control sources of electromagnetic radiation are each arranged to generate a plurality of pulses of electromagnetic radiation to be incident upon the atomic ensemble.

14. The quantum memory device as claimed in claim 1, wherein the clock rate of the pulses of electromagnetic radiation from the one or more control sources is less than the clock rate of the pulses of electromagnetic radiation from the signal source.

15. The quantum memory device as claimed in claim 1, wherein the subsequent electromagnetic radiation from the one or more control sources is arranged to be incident upon the atomic ensemble within the lifetime of the coherent excitation between the first and third states.

16. The quantum memory device as claimed in claim 15, wherein the pulses of electromagnetic radiation from the one or more control sources or the pulses of electromagnetic radiation from the signal source each have a clock rate having a time period that is less than the lifetime of the coherent excitation between the first and third states, or wherein the pulses of electromagnetic radiation from the one or more control sources or the pulses of electromagnetic radiation from the signal source each have a clock rate that is greater than 50 MHz.

17. The quantum memory device as claimed in claim 1, wherein the inverse of the residual Doppler linewidth owing to the incidence of the electromagnetic radiation generated by the signal source and the one or more control sources on the atomic valence electrons in the atomic ensemble is greater than half the lifetime of the coherent excitation of the transition between the first state and the third state.

18. A method of storing and retrieving one or more modes of electromagnetic radiation in a quantum memory device, the quantum memory device comprising:
an atomic ensemble comprising atomic valence electrons having a first state, a second state and a third state, wherein the second state has a higher energy than, and is linked to, the first state by an atomic transition, and the third state has a higher energy than, and is linked to, the second state by one or more atomic transitions;
the method comprising:
storing one or more modes of electromagnetic radiation in the atomic ensemble by:
stimulating off-resonant transitions of the atomic valence electrons in the atomic ensemble between the first state and the second state by arranging for one or more modes of electromagnetic radiation generated by a signal source of electromagnetic radiation to be incident upon the atomic ensemble, wherein the frequency of the electromagnetic radiation from the signal source corresponds to an off-resonant atomic transition between the first state and the second state of atomic valence electrons in the atomic ensemble, and wherein the signal source electromagnetic radiation has a bandwidth of greater than 1 GHz; and
stimulating off-resonant transitions of the atomic valence electrons in the atomic ensemble between the second state and the third state by arranging for electromagnetic radiation generated by one or more control sources of electromagnetic radiation to each be incident upon the atomic ensemble, wherein the frequency of the electromagnetic radiation from the one or more control sources each corresponds to an off-resonant atomic transition from the one or more atomic transitions linking the second state and the third state of atomic valence electrons in the atomic ensemble, and wherein the electromagnetic radiation from each of the one or more control sources has a bandwidth of greater than 1 GHz;
wherein the one or more modes of electromagnetic radiation from the signal source and the electromagnetic radiation from each of the one or more control sources are arranged to be incident upon the atomic ensemble such that a coherent excitation of the transition between the first state and the third state is created that stores the one or more modes of electromagnetic radiation from the signal source in the atomic ensemble; and
retrieving the one or more modes of electromagnetic radiation that have been stored in the atomic ensemble by:
further stimulating off-resonant transitions of the atomic valence electrons in the atomic ensemble between the second state and the third state by arranging for electromagnetic radiation generated by one or more control sources of electromagnetic radiation to each be incident upon the atomic ensemble after the one or more modes of electromagnetic radiation generated by the signal source have been stored in the atomic ensemble;
wherein the electromagnetic radiation from each of the one or more control sources is arranged to be incident upon the atomic ensemble to stimulate emission of the one or more stored modes of electromagnetic radiation from the atomic ensemble.

19. A quantum memory device for storing one or more modes of electromagnetic radiation, the quantum memory device comprising:
an atomic ensemble comprising atomic valence electrons having a first state, a second state and a third state, wherein the second state has a higher energy than, and is linked to, the first state by an atomic transition, and the third state has a higher energy than, and is linked to, the second state by one or more atomic transitions;
a signal source of electromagnetic radiation arranged to generate one or more modes of electromagnetic radiation to be stored having a frequency corresponding to an off-resonant atomic transition between the first state and the second state of atomic valence electrons in the atomic ensemble, wherein the one or more modes of electromagnetic radiation from the signal source are arranged to be incident upon the atomic ensemble to stimulate off-resonant transitions of the atomic valence electrons in the atomic ensemble between the first state and the second state;
one or more control sources of electromagnetic radiation each arranged to generate electromagnetic radiation having a frequency corresponding to an off-resonant atomic transition from the one or more atomic transitions linking the second state and the third state of atomic valence electrons in the atomic ensemble, wherein the electromagnetic radiation from the one or more control sources is arranged to be incident upon the atomic ensemble to stimulate off-resonant transitions of the atomic valence electrons in the atomic ensemble between the second state and the third state;
wherein the quantum memory device is arranged such that on incidence of one or more modes of electromagnetic radiation from the signal source and electromagnetic radiation from each of the one or more control sources to the atomic ensemble, a coherent excitation of the transition between the first state and the third state is created that stores the one or more modes of electromagnetic radiation from the signal source in the atomic ensemble, and subsequent incidence of electromagnetic radiation from each of the one or more control sources upon the atomic ensemble stimulates emission of the one or more stored modes of electromagnetic radiation from the atomic ensemble; and wherein the inverse of the residual Doppler linewidth owing to the incidence of the electromagnetic radiation generated by the signal source and the one or more control sources on the atomic valence electrons in the atomic ensemble is greater than half the lifetime of the coherent excitation of the transition between the first state and the third state.

20. A method of storing and retrieving one or more modes of electromagnetic radiation in a quantum memory device, the quantum memory device comprising:

an atomic ensemble comprising atomic valence electrons having a first state, a second state and a third state, wherein the second state has a higher energy than, and is linked to, the first state by an atomic transition, and the third state has a higher energy than, and is linked to, the second state by one or more atomic transitions;

the method comprising:

storing one or more modes of electromagnetic radiation in the atomic ensemble by:

stimulating off-resonant transitions of the atomic valence electrons in the atomic ensemble between the first state and the second state by arranging for one or more modes of electromagnetic radiation generated by a signal source of electromagnetic radiation to be incident upon the atomic ensemble, wherein the frequency of the electromagnetic radiation from the signal source corresponds to an off-resonant atomic transition between the first state and the second state of atomic valence electrons in the atomic ensemble; and stimulating off-resonant transitions of the atomic valence electrons in the atomic ensemble between the second state and the third state by arranging for electromagnetic radiation generated by one or more control sources of electromagnetic radiation to each be incident upon the atomic ensemble, wherein the frequency of the electromagnetic radiation from the one or more control sources each corresponds to an off-resonant atomic transition from the one or more atomic transitions linking the second state and the third state of atomic valence electrons in the atomic ensemble;

wherein the one or more modes of electromagnetic radiation from the signal source and the electromagnetic radiation from each of the one or more control sources are arranged to be incident upon the atomic ensemble such that a coherent excitation of the transition between the first state and the third state is created that stores the one or more modes of electromagnetic radiation from the signal source in the atomic ensemble;

wherein the inverse of the residual Doppler linewidth owing to the incidence of the electromagnetic radiation generated by the signal source and the one or more control sources on the atomic valence electrons in the atomic ensemble is greater than half the lifetime of the coherent excitation of the transition between the first state and the third state; and retrieving the one or more modes of electromagnetic radiation that have been stored in the atomic ensemble by:

further stimulating off-resonant transitions of the atomic valence electrons in the atomic ensemble between the second state and the third state by arranging for electromagnetic radiation generated by one or more control sources of electromagnetic radiation to each be incident upon the atomic ensemble after the one or more modes of electromagnetic radiation generated by the signal source have been stored in the atomic ensemble;

wherein the electromagnetic radiation from each of the one or more control sources is arranged to be incident upon the atomic ensemble to stimulate emission of the one or more stored modes of electromagnetic radiation from the atomic ensemble.

* * * * *